(12) United States Patent
Kamada et al.

(10) Patent No.: US 7,948,001 B2
(45) Date of Patent: May 24, 2011

(54) LED LIGHTING FIXTURE

(75) Inventors: Kazuo Kamada, Hirakata (JP); Yasushi Nishioka, Tsu (JP); Youji Urano, Ikeda (JP)

(73) Assignee: Panasonic Electric Works, Co., Ltd., Osaka (JP)

( * ) Notice: Subject to any disclaimer, the term of this patent is extended or adjusted under 35 U.S.C. 154(b) by 509 days.

(21) Appl. No.: 12/066,433

(22) PCT Filed: Sep. 20, 2006

(86) PCT No.: PCT/JP2006/318574
§ 371 (c)(1),
(2), (4) Date: Mar. 11, 2008

(87) PCT Pub. No.: WO2007/034803
PCT Pub. Date: Mar. 29, 2007

(65) Prior Publication Data
US 2010/0148196 A1    Jun. 17, 2010

(30) Foreign Application Priority Data

Sep. 20, 2005  (JP) ................................ 2005-272878
Sep. 20, 2005  (JP) ................................ 2005-272883

(51) Int. Cl.
*H01L 23/28* (2006.01)
*H01L 23/373* (2006.01)

(52) U.S. Cl. ..... 257/99; 257/98; 257/100; 257/E33.058; 257/E33.059; 257/E33.061

(58) Field of Classification Search ............ 257/98–100, 257/E33.058–E33.061
See application file for complete search history.

(56) References Cited

U.S. PATENT DOCUMENTS

| | | | |
|---|---|---|---|
| 6,498,355 B1 * | 12/2002 | Harrah et al. ................... | 257/99 |
| 6,500,891 B1 * | 12/2002 | Kropp et al. ................... | 524/430 |
| 6,541,800 B2 * | 4/2003 | Barnett et al. .................. | 257/98 |
| 6,874,910 B2 * | 4/2005 | Sugimoto et al. ............. | 362/294 |
| 6,936,855 B1 | 8/2005 | Harrah | |
| 7,495,322 B2 * | 2/2009 | Hashimoto et al. ........... | 257/676 |
| 2001/0030866 A1 * | 10/2001 | Hochstein ...................... | 362/294 |
| 2003/0007330 A1 * | 1/2003 | Kondo .......................... | 361/748 |
| 2003/0189830 A1 * | 10/2003 | Sugimoto et al. ............. | 362/294 |
| 2004/0079957 A1 * | 4/2004 | Andrews et al. .............. | 257/100 |
| 2004/0164311 A1 | 8/2004 | Uemura | |

(Continued)

FOREIGN PATENT DOCUMENTS
CN    1341966    3/2002
(Continued)

*Primary Examiner* — Allan R Wilson
(74) *Attorney, Agent, or Firm* — Greenblum & Bernstein, P.L.C.

(57) ABSTRACT

A light-emitting device held on a fixture body includes an LED chip, a heat transfer plate made of a thermally conductive material on which the LED chip is mounted, a wiring board having, on one side, patterned conductors, for supplying an electric power to the LED chip and formed with an aperture (exposure part) through which a LED chip mount surface of the heat transfer plate is exposed, an encapsulation part in which the LED chip is encapsulated on the one side of the wiring board, and a dome-shaped color-changing member made of a fluorescent material and an optically transparent material and placed on the one side of the wiring board. The light-emitting device is bonded to the fixture body with an insulating layer interposed therebetween, and the insulating layer has electrical insulating properties and is interposed between the heat transfer plate and the fixture body to thermally couple the same.

6 Claims, 14 Drawing Sheets

U.S. PATENT DOCUMENTS

| | | |
|---|---|---|
| 2005/0161771 A1 | 7/2005 | Suehiro et al. |
| 2006/0054915 A1* | 3/2006 | Chang .......................... 257/100 |
| 2007/0007540 A1 | 1/2007 | Hashimoto et al. |
| 2007/0085103 A1 | 4/2007 | Nishioka et al. |
| 2008/0030143 A1 | 2/2008 | Goriki et al. |
| 2009/0295265 A1* | 12/2009 | Tabuchi et al. ................ 313/112 |

FOREIGN PATENT DOCUMENTS

| | | |
|---|---|---|
| CN | 2634572 | 8/2004 |
| EP | 1418628 | 5/2004 |
| EP | 1603170 | 12/2005 |
| JP | 54-81454 | 6/1979 |
| JP | 7-79058 | 3/1995 |
| JP | 10-282916 | 10/1998 |
| JP | 2001-203396 | 7/2001 |
| JP | 2003-59332 | 2/2003 |
| JP | 2003-110146 | 4/2003 |
| JP | 2003-133596 | 5/2003 |
| JP | 2003-168829 | 6/2003 |
| JP | 2004-253651 | 9/2004 |
| JP | 2005-72382 | 3/2005 |
| JP | 2005-109282 | 4/2005 |
| JP | 2005-136224 | 5/2005 |
| JP | 2005-159045 | 6/2005 |
| JP | 3114129 | 8/2005 |
| WO | 2004/077580 | 9/2004 |
| WO | 2004/082036 | 9/2004 |

* cited by examiner

図 13

LED LIGHTING FIXTURE

TECHNICAL FIELD

The present invention relates to an LED lighting fixture including an LED chip (light-emitting diode chip)-containing light-emitting device as a light source.

BACKGROUND ART

Research and development have been widely conducted on light-emitting devices that use LED chips in combination with fluorescent materials (such as fluorescent pigments and dyes). In such devices, the fluorescent materials serve as wavelength conversion materials capable of being excited by light emitted from the LED chips and emitting light of a color different from that of the LED chips so that the devices can emit light of a color different from that emitted from the LED chips. Concerning this type of light-emitting devices, there have been commercially manufactured, for example, white light-emitting devices (generally called white LEDs) that use fluorescent materials in combination with blue or violet light-emitting LED chips to produce white light (white light emission spectrum).

As high output power white LEDs have been developed in recent years, research and development on application of white LEDs to lights have been aggressively conducted. For applications such as general lights that require a relatively large light output power, a single white LED is not enough to produce a desired light output power. Therefore, in general, a plurality of white LEDs are mounted on a circuit board to form an LED unit, and the entire LED unit is used to ensure the desired light output power (see, for example, Japanese Unexamined Patent Publication No. 2003-59332 (Patent Literature 1)).

It has also been proposed that an LED unit including a plurality of LED chips and a circuit board on which the respective LED chips are mounted has a structure for efficiently dissipating heat generated at a light-emitting part of each LED chip to outside such that an increase in junction temperature of each LED chip can be suppressed and that a light output power can be increased with an increase in input power (see, for example, Paragraph [0030] and FIG. 6 of Japanese Unexamined Patent Publication No. 2003-168829 (Patent Literature 2), and FIG. 6 of Japanese Unexamined Patent Publication No. 2001-203396 (Patent Literature 3)).

As shown in FIG. 18, the LED unit disclosed in Patent Literature 2 has a metal circuit board 300 that includes a metal plate 301 on which a patterned circuit 303 formed with patterned conductors is formed with an insulating resin layer 302 interposed therebetween, in which heat generated at each LED chip 10' can be transferred to the metal plate 301 through a heat transfer member 310. Each LED chip 10' is a blue GaN LED chip including a crystal growth substrate made of an insulating sapphire substrate and a light-emitting part made of GaN compound semiconductor materials and formed on one side of the crystal growth substrate. Each LED chip 10' is flip-chip mounted on the circuit board 300, and the other side of the crystal growth substrate forms a light output surface.

As shown in FIG. 19, the LED unit disclosed in Patent Literature 3 has a metal circuit board 300 on which each LED chip 10'' is mounted. Each LED chip 10'' has an anode electrode formed on one side and a cathode electrode formed on the other side. Out of the anode and cathode electrodes, the electrode closer to the circuit board 300 is electrically connected to a first conductor plate 312, and the electrode distant from the circuit board 300 is electrically connected to a second conductor plate 313 through a thin metal bonding wire 314. The first and second conductor plates 312 and 313 are respectively bonded to patterned circuits 303 of the circuit board 300.

In a case where the LED unit configured as shown in FIG. 18 or 19 is used for lighting fixtures, the fixture body may be made of a metal, and the metal plate 301 of the circuit board 300 in the LED unit may be thermally coupled to the fixture body so that heat from the LED unit can be efficiently dissipated. In order to ensure lighting surge resistance, at present, a heat radiating rubber sheet such as Sarcon (Registered Trademark) is interposed as a sheet-shaped insulating material (insulating layer) between the fixture body and the metal plate 301 of the circuit board 300. In such a conventional technique, a portion from the light-emitting part of each LED chip 10' or 10'' to the fixture body has a high level of thermal resistance, and therefore the power input to each LED chip 10' or 10'' has to be limited such that the junction temperature of each LED chip 10' or 10'' does not exceed the maximum junction temperature, which makes it difficult to increase the light output power.

When the heat radiating sheet is interposed between the metal plate 301 of the circuit board 300 and the fixture body, the heat radiating sheet may be insufficiently bonded to the metal plate 301 so that a void may be formed between the metal plate 301 and the heat radiating sheet to increase the thermal resistance or to cause variations in thermal resistance of the portion from the light-emitting part of each LED chip 10' or 10'' to the fixture body.

In the LED unit disclosed in Patent Literature 2, the heat generated at the light-emitting part of the LED chip 10' is transferred to the metal plate 301 through the heat transfer member 310 that is smaller in size than the LED chip 10'. Therefore, the portion from the LED chip 10' to the metal plate 301 has a relatively high level of thermal resistance. When the sapphire substrate serving as a crystal growth substrate is mounted so as to be thermally coupled to the metal plate 301, there is also a problem in which the sapphire substrate provides high thermal resistance.

The present invention has been made in light of the circumstances described above, and it is an object of the present invention to provide an LED lighting fixture in which an increase in temperature of an LED chip can be suppressed so that a light output power can be increased.

DISCLOSURE OF THE INVENTION

An LED lighting fixture according to the present invention is characterized by including: a light-emitting device that includes an LED chip, a heat transfer plate made of a thermally conductive material and having one side on which the LED chip is mounted, a wiring board having on one side a patterned conductor for supplying an electric power to the LED chip, being bonded to an LED chip mount-side of the heat transfer plate, and being formed with an exposure part through which the LED chip mount-side on the heat transfer plate is exposed, an encapsulation part in which the LED chip is encapsulated on the one side of the wiring board, and a dome-shaped color-changing member formed with an optically transparent material and a fluorescent material excited by light emitted from the LED chip and emitting light of a color different from a color of the light emitted from the LED chip, and placed to surround the encapsulation part on the one side of the wiring board; a metal fixture body on which the LED chip-containing light-emitting device is held; and an insulating layer having electrical insulating properties and being interposed between the heat transfer plate and the fixture body to thermally couple the same, wherein the light-emitting device is bonded to the fixture body with the insulating layer interposed therebetween.

These features can reduce thermal resistance of a portion from the light-emitting part of the LED chip to the fixture body, increase thermal radiation performance, suppress an increase in junction temperature of the LED chip, so that a light output power can be increased with an increase in input electric power, as compared with a conventional case where a heat radiating sheet is interposed between the fixture body and the circuit board on which the LED chip is mounted. When used with the light output power same as that of the conventional case, the LED lighting fixture of the present invention has an advantage that the junction temperature of the LED chip can be lowered so that the LED chip can have a longer life, as compared with the conventional LED lighting fixture.

Preferably, in the light-emitting device, the LED chip is mounted on the heat transfer plate with a sub-mount member that is interposed therebetween to relax a stress applied to the LED chip due to a difference in coefficient of linear expansion between the LED chip and the heat transfer plate.

In this case, it is possible to prevent breakage of the LED chip caused by the difference in coefficient of linear expansion between the LED chip and the heat transfer plate to increase reliability.

Preferably, the sub-mount member has an area larger than that of the LED chip, and is dimensionally set such that a rim of the sub-mount member is placed outside a truncated cone having an upper base formed by a circle inscribed in a sub-mount member-facing surface of the LED chip and a lower base formed by a circle circumscribed about another surface of the heat transfer plate.

In this case, the area of the sub-mount member is larger than that of the LED chip so that lower thermal resistance can be provided between the LED chip and the mount board. As the sub-mount member is dimensionally set such that the rim of the sub-mount member is placed outside the truncated cone having the upper base formed by the circle inscribed in the sub-mount member-facing surface of the LED chip and the lower base formed by the circle circumscribed about the other surface of the heat transfer plate, heat generated at the LED chip is allowed to linearly flow along a path from the LED chip to an end of the other surface of the heat transfer plate through the sub-mount member, so that the heat from the LED chip can be efficiently transferred to the entire other side of the heat transfer plate. Namely, the heat generated at the LED chip can be transferred to a wider area and dissipated through the entire other surface of the heat transfer plate, so that the heat radiation efficiency can be increased and that an increase in junction temperature of the LED chip can be suppressed. Therefore, the output power and the life can be further increased.

More preferably, the truncated cone is set to have a generatrix that makes an angle of 45Ω with the lower base.

In this case, efficiency of heat transfer from the LED chip to the other surface of the heat transfer plate can become higher than that in a case where other angles are selected.

The insulating layer is preferably formed with a resin sheet that contains a filler and is reduced in viscosity when heated.

In this case, it is possible to prevent an increase in thermal resistance, which would otherwise be caused by formation of a void between the heat transfer plate and the insulating layer due to insufficient adhesion between the heat transfer plate and the insulating layer or due to secular change of the insulating layer.

The insulating layer is preferably set to have a two-dimensional size larger than that of the heat transfer plate.

In this case, a creeping distance between the heat transfer plate and the fixture body can be increased and lighting surge resistance can be enhanced, as compared with a case where the insulating layer and the heat transfer plate are formed in the same two-dimensional size.

The color-changing member is preferably placed such that an air layer is formed inside the color-changing member.

In this case, the air layer can function as a thermal insulation layer to suppress transfer of heat from the color-changing member to the LED chip and to inhibit an increase in temperature of the LED chip.

BEST MODE FOR CARRYING OUT THE INVENTION

Embodiment 1

An LED lighting fixture according to the present embodiment is described in detail below with reference to FIGS. 1 to 9 attached hereto.

Figure 7:
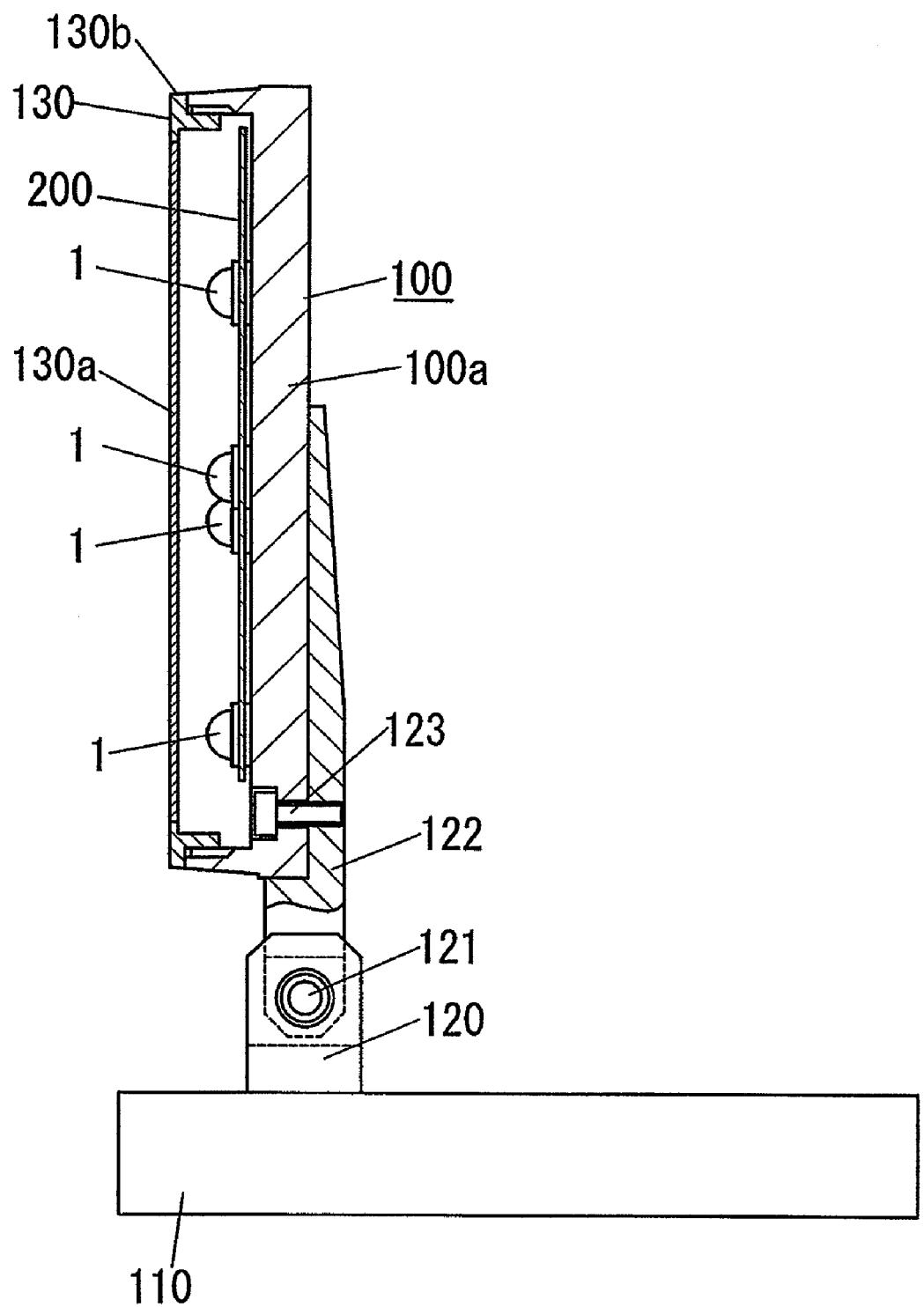
FIG. 7 is a partially exploded schematic side view of the LED lighting fixture of FIG. 1.
Figure 8:
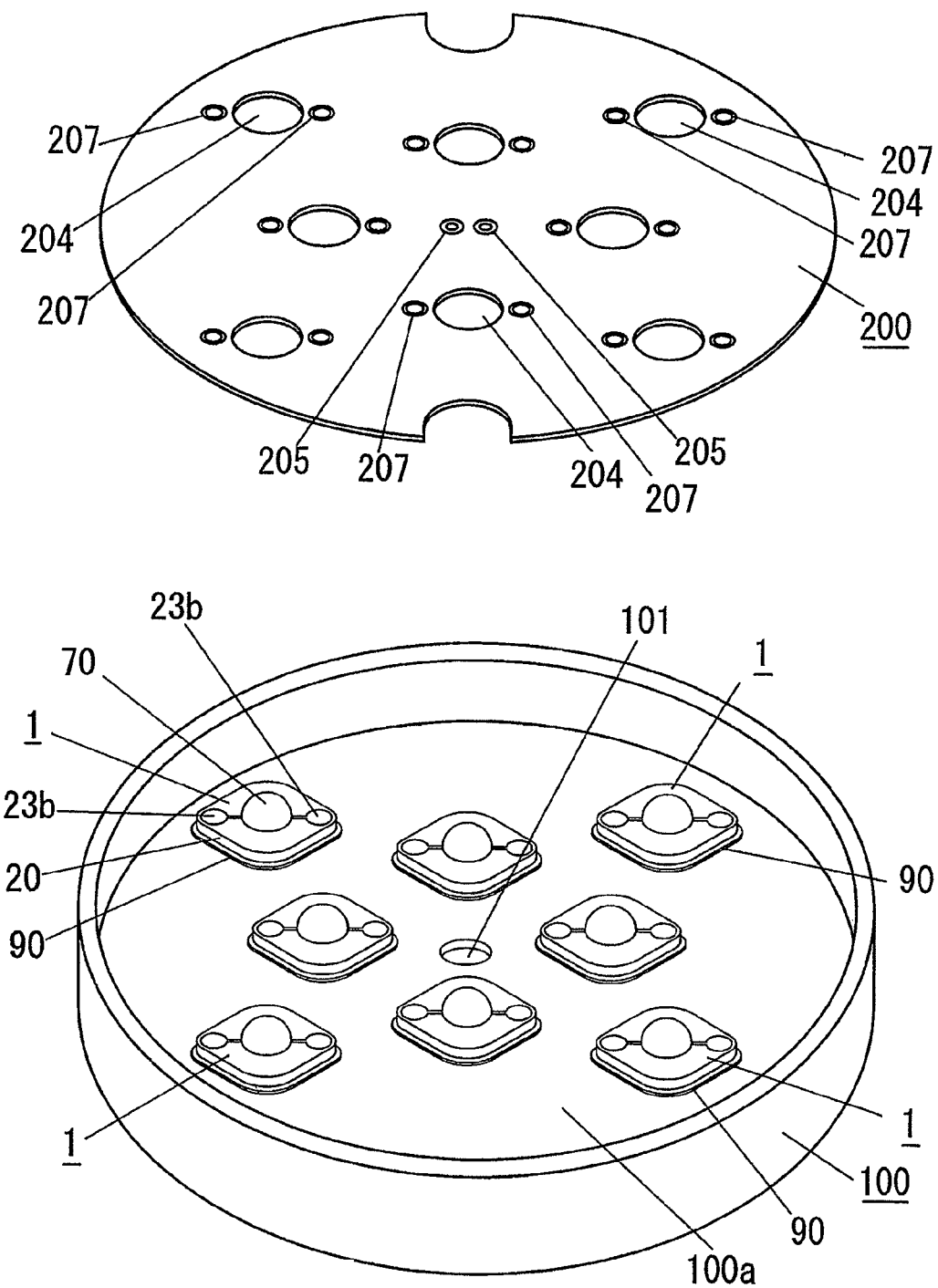
FIG. 8 is an exploded schematic perspective view showing the main part of the LED lighting fixture of FIG. 1.

The LED lighting fixture of the present embodiment is typically for use as a spotlight and includes, as shown in FIG. 7, a mount 110, a rotary base 120 fixed on the mount 110, an arm 122 with its one end coupled to the rotary base 120 with a screw shaft 121, and a fixture body 100 of a metal (for example, a highly thermal conductive metal such as Al and Cu) coupled to the arm 122 with a coupling screw 123.

The fixture body 100 is in the form of a bottomed shallow cylinder having an opening on one end. A plurality of light-emitting devices 1 (eight devices in the present embodiment) and a circular plate-shaped circuit board 200 (see FIG. 8) are housed in the fixture body 100, and the one end is sealed with a front cover 130. Each light-emitting device 1 includes an LED chip 10 and a mount board 20 having patterned conductors 23, 23 for power supply to the LED chip 10. The LED chip 10 is mounted on the mount board 20. The circuit board 200 has a patterned circuit wiring (not shown) defining the relation of the connection between the respective light-emitting devices 1 and also has apertures 204 through which the respective light-emitting devices 1 are partially inserted at sites corresponding to the respective light-emitting devices 1. The insulating base material for the circuit board is typically, but not limited to, a glass-epoxy resin such as FR4 or alternatively a polyimide resin, a phenol resin or the like.

In the LED lighting fixture of the present embodiment, each light-emitting device 1 is mounted on the bottom wall 100a of the fixture body 100 so that each light-emitting device 1 is held on the fixture body 100. The circuit board 200 having the apertures 204 at cites corresponding to the respective light-emitting devices 1 is placed apart from the bottom wall 100a of the fixture body 100 such that the peripheral portion of each aperture 204 overlaps the peripheral portion of the mount board 20 of each light-emitting device 1. The size of the aperture 204 is set larger than the outer diameter of a color-changing member 70 as described later.

The pattern of the patterned wiring of the circuit board 200 is designed to establish the relation of series connection of the plurality of light-emitting devices 1. The patterned wiring is electrically connected to a pair of power supply wires (not shown) provided through a wire insertion hole 101 (see FIG. 8) formed through the central portion of the bottom wall 100a of the fixture body 100. Specifically, each of the wires is inserted through the inside of each of a pair of through-hole wirings 205, 205 formed at the central portion of the circuit board 200 and then connected to each of the through-hole wirings 205, 205 with a solder. In the circuit board 200, plated through-holes 207 are also formed at the peripheral portion of each aperture 204 to electrically connect the patterned circuit to the patterned conductor 23 of the light-emitting device 1. In this structure, each of the through-hole wirings 205, 205 for connecting each wire and each of the plated through-hole 207 for connecting the light-emitting device are formed so as to cover the inside wall of the through hole (extending in the direction of the thickness of the circuit board 200) and to cover portions around the through hole on both sides of the circuit board 200 and connected to the patterned circuit. In the circuit board 200, the patterned circuit is formed on one side that faces the bottom wall 100a of the fixture body 100, while a light reflecting layer including a metal layer or a white-colored resist layer (not shown) is formed on the other side.

The circuit board 200 is also configured to define the relation of the connection of the respective light-emitting devices 1 and to supply power thereto from a power supply circuit (not shown) through the pair of wires. For example, the power supply circuit to be used may include a diode bridge-containing rectifier circuit for rectifying and smoothing an AC output from an AC power source such as a commercial power source, and a smoothing capacitor for smoothing the output from the rectifier circuit. In the present embodiment, the plurality of light-emitting devices 1 are connected in series. However, the relation of the connection of the light-emitting devices 1 is not limited thereto, and they may be connected in parallel or in a combination of series and parallel.

The front cover 130 includes an optically transparent plate 130a made of a circular glass plate and a circular window frame 130b that holds the optically transparent plate 130a. The window frame 130b is attached to the fixture body 100. The optically transparent plate 130a is not limited to a glass plate and may be made of any optically transparent material. A lens or lenses for controlling the distribution of light from the respective light-emitting devices 1 may be integrally formed with the optically transparent plate 130a.

Figure 1:
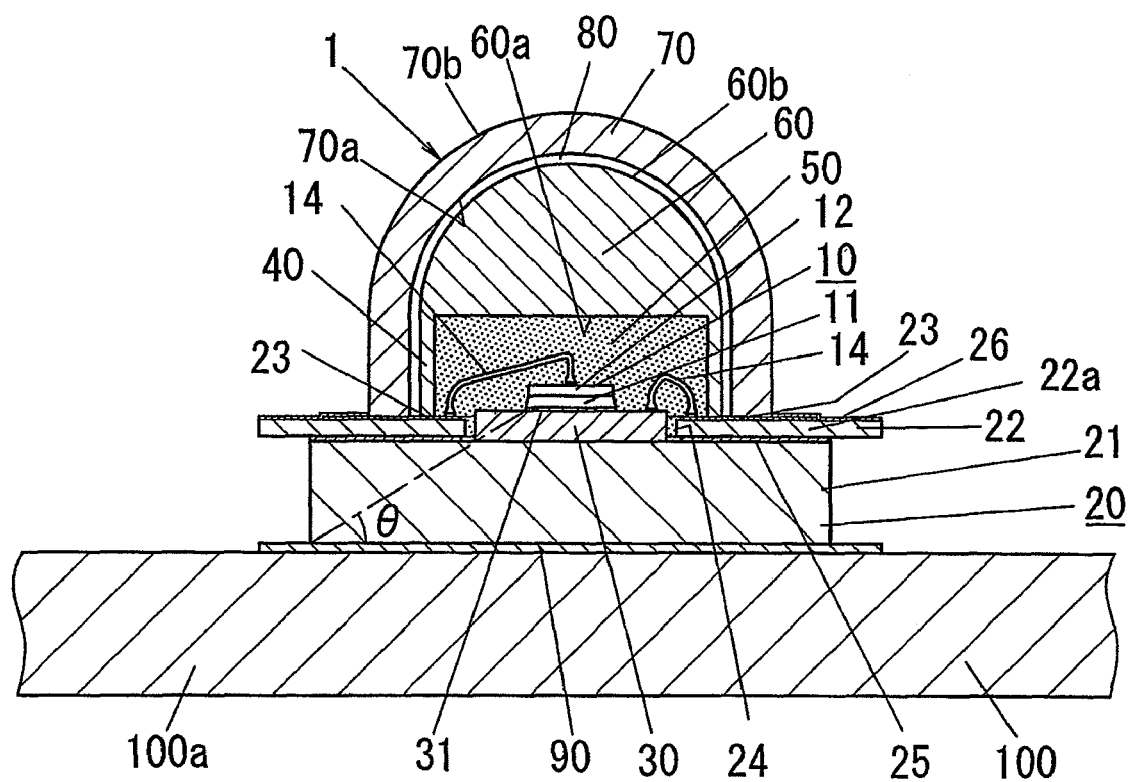
FIG. 1 is a schematic cross-sectional view of a light-emitting device in an LED lighting fixture according to Embodiment 1 of the present invention.
Figure 2:
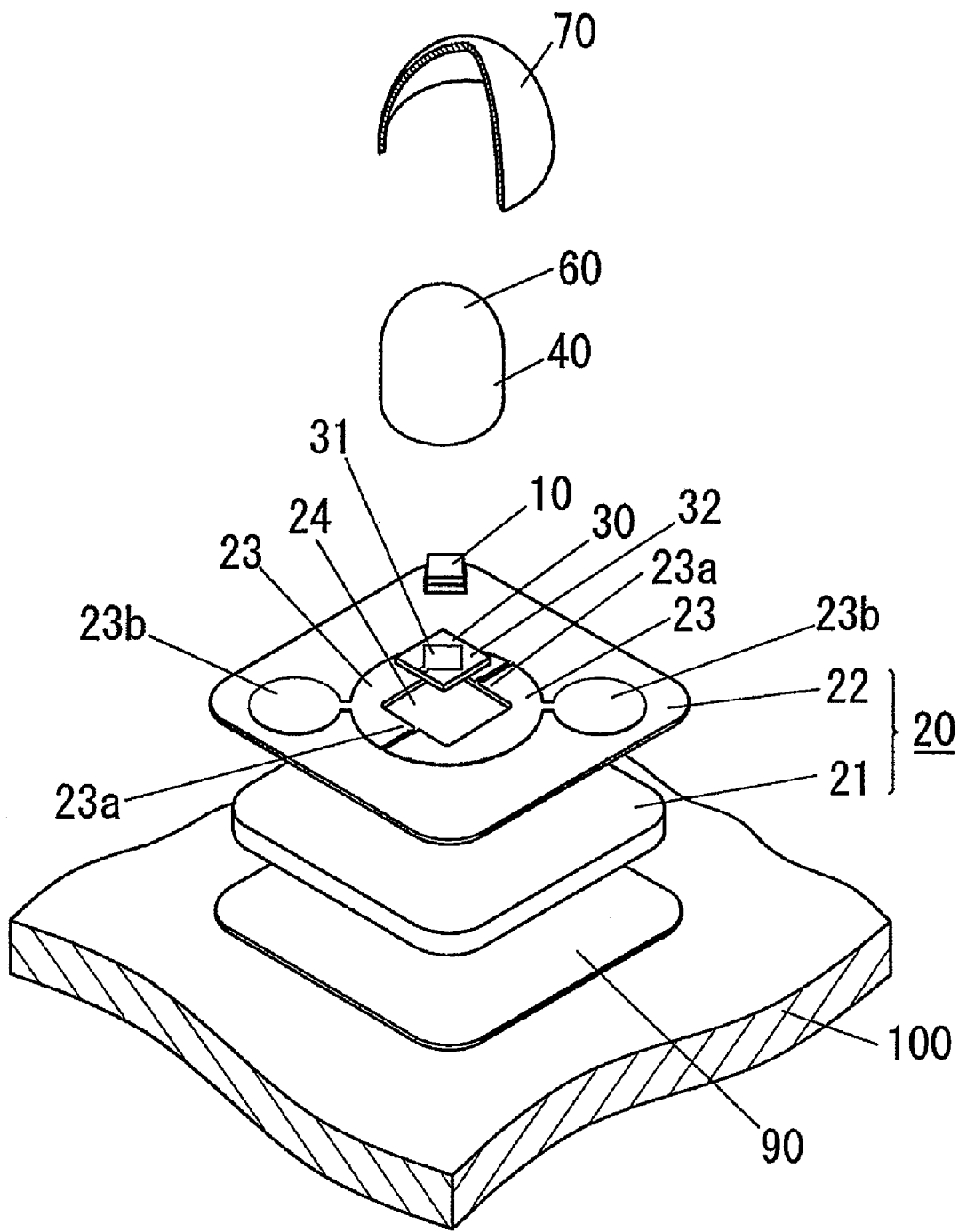
FIG. 2 is a partially exploded schematic perspective view showing the main part of the light-emitting device in the LED lighting fixture of FIG. 1.

As shown in FIG. 1, the light-emitting device 1 includes: an LED chip 10; a mount board 20 on which the LED ship 10 is mounted; a frame 40 provided to surround the LED chip 10 on the mount surface side of the mount board 20; bonding wires 14, 14 electrically connected to the LED chip 10; an optically transparent and elastic encapsulation part 50 including an encapsulant resin and encapsulating the LED chip 10 and the bonding wires 14, 14 inside the frame 40; an optical component 60 including a lens that is integrally formed with the frame 40 to control the distribution of light emitted from the LED chip 10 and transmitted through the encapsulation part 50; and a dome-shaped color-changing member 70 that includes an optically transparent material and a fluorescent material capable of being excited by light from the LED chip 10 and capable of emitting light of a color different from the color of the emission from the LED chip 10 and is placed so as to surround the encapsulation part 50 with the mount board 20. In this structure, the color-changing member 70 is placed on the LED chip 10 mount surface side of the mount board 20 such that an air layer 80 is formed between the light output surface 60b of the optical component 60 and the outer surface of the frame 40 (in other words, in the present embodiment, the encapsulation part 50 is surrounded by the frame 40 and the optical component 60, and the color-changing member 70 is placed so as to surround the optical component 60 and the frame 40).

The mount board 20 includes: a rectangular heat transfer plate 21 made of a thermally conductive material on which the LED chip 10 is mounted; and a rectangular wiring board 22 bonded to one side (the upper side in FIG. 1) of the heat transfer plate 21. The center portion of the wiring board 22 has a rectangular aperture 24 through which the mount surface (part of the one side) of the heat transfer plate 21 for receiving the LED chip 10 is exposed. The LED chip 10 is mounted on the heat transfer plate 21 with a sub-mount member 30 that is interposed therebetween and placed inside the aperture 24. The heat generated at the LED chip 10 is transferred to the sub-mount member 30 and the heat transfer plate 21 not through the wiring board 22. In the present embodiment, Cu, a high thermal-conductivity metal, is used as the thermally conductive material for the heat transfer plate 21

(namely, a metal plate is used as the heat transfer plate 21). However, the thermally conductive material is not limited to Cu and may be any other metal such as Al or any nonmetallic material having high thermal conductivity similarly to these metals. In the present embodiment, the aperture 24 of the wiring board 22 forms an exposure part through which the mount surface of the heat transfer plate 21 for receiving the LED chip 10 is exposed.

The wiring board 22 includes: an insulating substrate 22a made of a glass-epoxy resin base material; and a pair of patterned power-supply conductors (patterned leads) 23, 23 electrically connected to the respective electrodes (not shown) of the LED chip 10. The patterned conductors 23, 23 each include a laminated film of Cu, Ni and Au films. In the plan view, the patterned conductors 23, 23 have inner lead portions 23a, 23a inside the frame 40 and have outer lead portions 23b, 23b outside the color-changing member 70. The heat transfer plate 21 is bonded to the wiring board 22 with a bonding sheet 25 that is made of an insulating adhesive film sheet and interposed therebetween. The material for the insulating substrate 22a may be a glass-epoxy resin such as FR4 or any other material such as a polyimide resin and a phenol resin.

Figure 3:
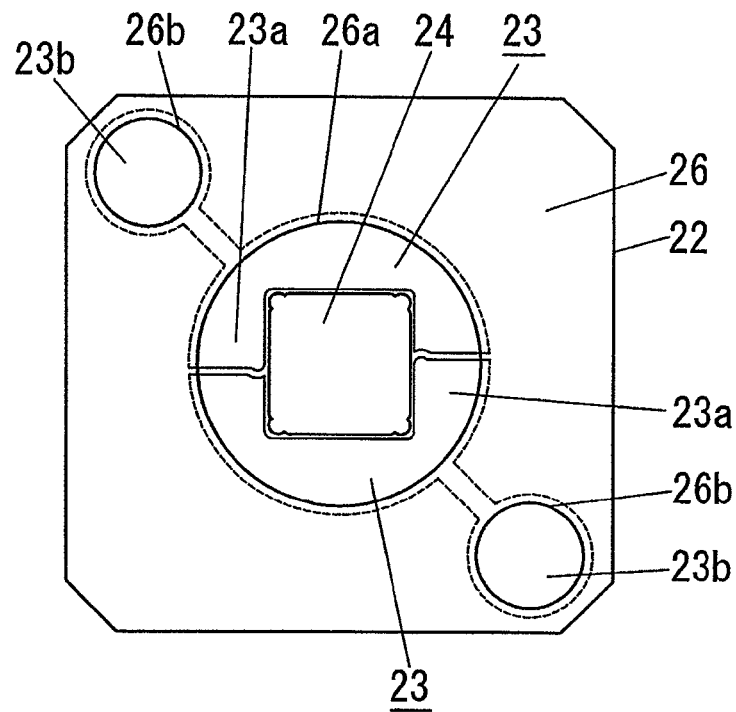
FIG. 3 is a schematic plan view showing the main part of the light-emitting device in the LED lighting fixture of FIG. 1.

In the wiring board 22, a resist layer 26 made of a white-colored resin is also laminated on the surface of the insulating substrate 22a, opposite to the heat transfer plate 21 side, to cover part of the patterned conductors 23, 23 and to cover a portion of the insulating substrate 22a where the patterned conductors 23, 23 are not formed (see FIG. 3). Therefore, light incident on the surface of the resist layer 26 from the side of the LED chip 10 is reflected therefrom so that absorption of the light from the LED chip 10 through the wiring board 22 surface opposite to the heat transfer plate 21 side can be prevented, which can increase the light output efficiency and thus can increase the optical output.

The resist layer 26 has an aperture 26a in which the inner lead portions 23a, 23a of the respective patterned conductors 23, 23 are exposed in the vicinity of the aperture 24 of the wiring board 22. The resist layer 26 also has apertures 26b, 26b in which the outer leads 23b, 23b of the respective patterned conductors 23, 23 are exposed, respectively, at the peripheral portion of the wiring board 22.

The LED chip 10 is a blue GaN LED chip that emits blue light and includes: an n-type electrically conductive SiC substrate 11, which is used as a crystal growth substrate and whose lattice constant and crystal structure are closer to those of GaN than to those of a sapphire substrate; a light-emitting part 12 that is formed of GaN compound semiconductor materials on the main surface of the electrically conductive substrate 11 by an epitaxial growth method (such as the MOVPE method) and includes a laminated structure typically having a double heterostructure; a cathode electrode (n electrode, not shown) formed on the back surface of the electrically conductive substrate 11; and an anode electrode (p electrode, not shown) formed on the front surface of the light-emitting part 12 (the uppermost surface on the main surface side of the electrically conductive substrate 11). In general, the LED chip 10 has an anode electrode formed on one side and a cathode electrode formed on the other side. The cathode electrode and the anode electrode are each a laminated film of Ni and Au films. However, any other material capable of achieving good ohmic features, such as Al, may also be used as the material for the cathode and anode electrodes.

In the present embodiment, the LED chip 10 is mounted on the heat transfer plate 21 such that the light-emitting part 12 is placed more distant from the heat transfer plate 21 than from the electrically conductive substrate 11. Alternatively, the LED chip 10 may be mounted on the heat transfer plate 21 such that the light-emitting part 12 is placed closer to the heat transfer plate 21 than to the electrically conductive substrate 11. In view of light output efficiency, the light-emitting part 12 should preferably be placed to be distant from the heat transfer plate 21. In the present embodiment, however, since the refractive index of the electrically conductive substrate 11 is substantially the same as that of the light-emitting part 12, the light output loss does not significantly increase even when the light-emitting part 12 is placed to be close to the heat transfer plate 21.

In the present embodiment, the LED chip 10 used is a blue LED chip, which emits blue light, and the electrically conductive substrate 11 used is a SiC substrate. However, a GaN substrate may be used in place of the SiC substrate. As is apparent from Table 1 below, the SiC or GaN substrate used as a crystal growth substrate can have high thermal conductivity and small thermal resistance as compared with a sapphire substrate, which is an insulator used as a crystal growth substrate as disclosed in Patent Literature 2. Alternatively, the color of the light emitted from the LED chip 10 may be any color other than blue, such as red and green. Specifically, any semiconductor material other than the GaN compound semiconductor material, such as a GaAs or GaP compound semiconductor material, may be used as the material for the light-emitting part 12, depending on the color of the light to be emitted from the LED chip 10. Any substrate other than the SiC substrate, such as a GsAs or GsP substrate, may also be used as the electrically conductive substrate 11, depending on the material for the light-emitting part 12.

TABLE 1

| Crystal Growth Substrate | Thermal Conductivity (W/m · K) | Linear Expansion Coefficient ($\times 10^{-6}$/K) | Thermal Resistance (K/W) |
| --- | --- | --- | --- |
| 6H—SiC | 350 | 4.2 | 0.857 |
| GaN | 130 | 5.59 | 2.308 |
| GaP | 110 | 4.65 | 2.727 |
| GaAs | 54 | 5.9 | 5.556 |
| Sapphire | 42 | 5.3 | 7.143 |

In Table 1, the thermal resistance value is measured when heat is conducted in the thickness direction through the crystal growth substrate with a thickness of 0.3 mm and a cross-sectional area of 1 mm$^2$ perpendicular to the thickness direction.

The LED chip 10 is mounted on the heat transfer plate 21 with the sub-mount member 30 that is in the form of a rectangular plate larger in size than the LED chip 10 and interposed therebetween to relax the stress applied to the LED chip 10 due to the difference in coefficient of linear expansion between the LED chip 10 and the heat transfer plate 21. The sub-mount member 30 has not only the function of relaxing the stress but also the function of conducting heat from the LED chip 10 to a certain area of the heat transfer plate 21 larger than the LED chip 10.

It is preferred that the surface area of the heat transfer plate 21 on the LED chip 10 side should be sufficiently larger than that of the LED chip 10 on the heat transfer plate 21 side. For example, in order to efficiently exhaust heat from the LED chip 10 of 0.3 to 1.0 mm square, it is preferred that the contact area between the heat transfer plate 21 and an insulating layer 90 interposed between the heat transfer plate 21 and the fixture body 100 as described later should be increased and that the heat resistance should be reduced such that heat from the LED chip 10 can be uniformly conducted over a large area. Therefore, the surface area of the heat transfer plate 21 on the LED chip 10 side is preferably 10 times or more that of the LED chip 10 on the heat transfer plate 21 side.

More specifically, the area of the heat transfer plate 21 (the area of the plane perpendicular to the thickness direction) should be determined such that the junction temperature of the LED chip can be equal to or lower than a certain temperature, which is set lower than the maximum junction temperature, when the ambient temperature, the optical output and the applied power for the LED chip 10 are set to meet the specified conditions for the light emission. It should be noted that in this process, the junction temperature of the LED chip 10 is not directly measured, and the area of the heat transfer plate 21 is determined such that the temperature of the fixture body 100-facing surface of the heat transfer plate 21 (the other side of the heat transfer plate 21 opposite to the above side in the thickness direction) is equal to or lower than a specified temperature. In other words, if the conditions for the emission from the LED chip 10 are determined, the area of the heat transfer plate 21 can be determined. In order to reduce the area required for a single piece of the LED chip 10, the area of the heat transfer plate 21 should preferably be reduced. In order to reduce the area of the heat transfer plate 21, it is necessary to efficiently conduct heat from the LED chip 10 to the other side (the back surface).

In the plan view, a truncated cone may be provided in which the upper base is formed by a circle inscribed in the sub-mount member 30-facing surface of the LED chip 10, and the lower base is formed by a circle circumscribed about the other surface of the heat transfer plate 21. As a result of experiments, it has been found that the generatrix of this truncated cone should preferably make an angle θ of 45° with the lower base (see FIG. 1). In order to efficiently conduct heat from the LED chip 10 to the entire other surface of the heat transfer plate 21 with the angle set at about 45°, heat should preferably be conducted in a linear manner from the LED chip 10 to the other surface of the heat transfer plate 21.

Therefore, it is preferred that the sub-mount member 30 should be dimensionally set such that the rim of the sub-mount member 30 is placed outside the generatrix of the truncated cone. In this case, linear heat flow can be achieved from the LED chip 10 to the edge of the other surface of the heat transfer plate 21 so that the heat generated at the LED chip can be efficiently conducted to the entire other surface of the heat transfer plate 21.

In the present embodiment, AlN, which has relatively high thermal conductivity and insulating properties, is used as the material for the sub-mount member 30. In the LED chip 10, the cathode electrode is electrically connected to one of the patterned conductors 23 through the bonding wire 14 of a thin metal wire (such as a thin gold or aluminum wire) and through a patterned conductor 31 formed on the surface of the sub-mount member 30, opposite to the heat transfer plate 21 side, and the anode electrode is electrically connected to the other patterned conductor 23 through the bonding wire 14. In this structure, the sub-mount member 30 has a reflecting film (such as a laminated film of Ni and Ag films) that is formed around the patterned conductor 31 to reflect light from the side of the LED chip 10. The LED chip 10 is bonded to the sub-mount member 30 with a lead-free solder such as AuSn and SnAgCu.

The material for the sub-mount member 30 is not limited to AlN. As is apparent from Table 2, for example, other materials having relatively high thermal conductivity and having a linear expansion coefficient relatively close to that of 6H—SiC (the material of the electrically conductive substrate 11) may also be used, such as CuW, W, complex SiC, and Si. When an electrically conductive material such as CuW and W is used as the material for the sub-mount member 30, forming the patterned conductor 31 is not necessarily required.

TABLE 2

| | Materials | Linear Expansion Coefficient (×10$^{-6}$/K) | Thermal Conductivity (W/m · K) |
|---|---|---|---|
| Materials for Crystal Growth Substrate | 6H—SiC | 4.2 | 350 |
| | GaN | 5.59 | 130 |
| | GaP | 4.65 | 110 |
| | GaAs | 5.9 | 54 |
| | Sapphire | 5.3 | 42 |
| Materials for Sub-Mount Member | Al | 23.2 | 237 |
| | Cu | 16.6 | 398 |
| | W | 4.5 | 178 |
| | CuW | 6.4 | 160 |
| | Si | 2.6 | 168 |
| | AlN | 4.6 | 165 |
| | Alumina | 7.1 | 29 |
| Bonding Materials | Au | 14.2 | 315 |
| | 63Sn—37Pb | 21.0 | 50 |
| | Silver Paste | 70.0 | 1.1 |

When the heat transfer plate 21 is made of Cu, the sub-mount member 30 may be made of CuW or W so that the sub-mount member 30 can be directly bonded to the heat transfer plate 21. As shown in Table 3 below, for example, the direct bonding between the sub-mount member 30 and the heat transfer plate 21 can increase the joint area between the sub-mount member 30 and the heat transfer plate 21 and reduce the heat resistance of the joint portion between the sub-mount member 30 and the heat transfer plate 21 as compared with brazing between the sub-mount member 30 and the heat transfer plate 21. While the LED chip 10 may be bonded to the sub-mount member 30 with a solder such as SnPb, AuSn, and SnAgCu, or a silver paste, they are preferably bonded to each other with a lead-free solder such as AuSn and SnAgCu. When the sub-mount member 30 is made of Cu and when AuSn is used for bonding, a metal layer of Au or Ag should be formed by pre-treatment on the surface of the sub-mount member 30 to be bonded.

TABLE 3

| | Brazing | Direct Bonding |
|---|---|---|
| Joint Area | 60 to 80% | Almost 100% |
| Bonding Strength | 98 N/mm$^2$ or more | 127 N/mm$^2$ or more |
| Shear Strength | 98 N/mm$^2$ | 127 N/mm$^2$ |
| Joint Portion | Flux remains in some cases. | |

When the sub-mount member 30 is made of W and directly bonded to the heat transfer plate 21, as apparent from Table 4 below, an increased thermal conductivity and a reduced thermal resistance can be provided as compared with when the sub-mount member 30 and the heat transfer plate 21 are bonded with a silver brazing. When the heat transfer plate 21 is made of Cu and when AlN, complex SiC or the like is used as the material for the sub-mount member 30, the heat transfer plate 21 and the sub-mount member 30 may be bonded to each other with a lead-free solder such as AuSn and SnAgCu. When AuSn is used for bonding, a metal layer of Au or Ag should be formed by pre-treatment on the surface of the heat transfer plate 21 to be bonded.

TABLE 4

|  | Ag Brazing | Direct Bonding |
|---|---|---|
| Thermal Conductivity (W/m·K) | 185.4 | 211.8 |

In the present embodiment, the sub-mount member 30 of the light-emitting device 1 has such a thickness that the surface of the sub-mount member 30 is more distant from the heat transfer plate 21 than from the surface of the resist layer 26 of the wiring board 22. Therefore, light emitted from the LED chip 10 to the side can be prevented from being absorbed into the wiring board 22 through the inner circumference surface of the aperture 24 of the wiring board 22 and can also be prevented from being released through the joint between the color-changing member 70 and the mount board 20 (namely, blue light from the LED chip 10 can be prevented from bypassing the color-changing member 70 to the outside). As described above, the reflecting film 32 for reflecting light from the LED chip 10 is formed on the surface of the sub-mount member 30 around the patterned conductor 31 at the site where the LED chip 10 is bonded. Therefore, light from the side of the LED chip 10 can be prevented from being absorbed into the sub-mount member 30 so that the light output efficiency can be further increased.

Figure 4:
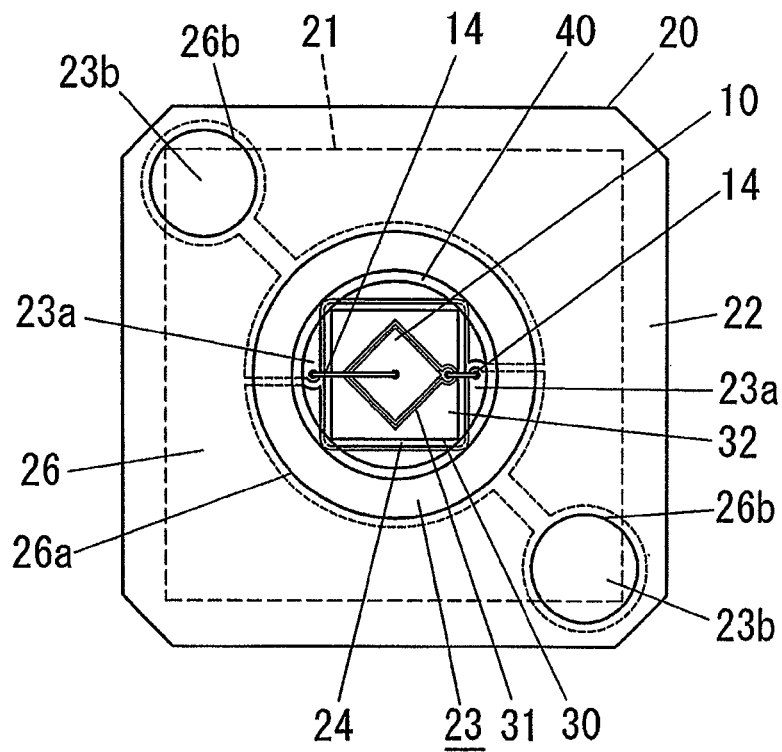
FIG. 4 is a schematic plan view showing the main part of the light-emitting device in the LED lighting fixture of FIG. 1.

As shown in FIG. 4, the LED chip 10 and the sub-mount member 30 of the light-emitting device 1 each has a two-dimensionally square peripheral shape. In the plan view, the LED chip 10 is bonded at the center portion of the sub-mount member 30 such that the peripheral line of the LED chip 10 is located inside the peripheral line of the sub-mount member 30 and that both peripheral lines do not become parallel to each other, so that the diagonal line of the LED chip 10 is not parallel to that of the sub-mount member 30. More specifically, the LED chip 10 is bonded at the center portion of the sub-mount member 30 such that the diagonal line of the LED chip 10 makes an angle of about 45° with that of the sub-mount member 30.

Therefore, the direct distance between both ends of the bonding wire 14 extended along a diagonal line of the LED chip 10 (namely, the distance between the electrode on the surface of the LED chip and the inner lead portion 23a of the patterned conductor 23 electrically connected to the electrode via the bonding wire) can be shortened, while the two-dimensional size of the sub-mount member 30 is not reduced, as compared with a case where the peripheral lines of the LED chip 10 and the sub-mount member 30 are parallel to each other, so that a bonding wire 14-induced reduction in light output efficiency can be suppressed and that the size of the frame 40 and the overall size of the light-emitting device 1 can be reduced. In summary, a bonding wire 14-induced reduction in light output efficiency can be suppressed, and the size of the frame 40 and the overall size of the light-emitting device 1 can be reduced, with no degradation in the heat transfer function of the sub-mount member 30.

The encapsulant resin used as the material for the encapsulant part 50 is a silicone resin. However, the material is not limited to a silicone resin but may be an acrylic resin or the like.

The frame 40 is in the form of a cylinder. The frame 40 and the optical component 60 are integrally formed of the same optically transparent material (such as silicone) (in other words, the optical component 60 and the frame 40 are continuously and integrally formed). In a lens block composed of the frame 40 and the optical component 60, the space surrounded by the frame 40 and the optical component 60 forms recess for housing the LED chip. The frame 40 and the optical component 60 each have the same refractive index and the same linear expansion coefficient as the encapsulation part 50. The frame 40 and the optical component 60 may be integrally formed of an optically transparent material whose refractive index and elastic modulus are not lower than those of the encapsulant resin material of the encapsulation part 50. For example, when the encapsulant resin is an acrylic resin, the optical component 60 and the frame 40 may be integrally formed of an acrylic resin. The optically transparent materials for the optical component 60 and the frame 40 may have substantially the same linear expansion coefficient as that of the encapsulant resin.

The optical component 60 has a light incidence surface 60a and a light output surface 60b. The light incidence surface 60a is formed on the encapsulation part 50 side and in the form of a plane. The light output surface 60b is a convex surface and forms a plano-convex lens that does not allow light from the light incidence surface 60a to be totally reflected at the interface between the light output surface 60b and the air layer 80 described above. The optical component 60 is placed such that the optical axis of the optical component 60 is aligned with the center line of the light-emitting part 12 along the thickness direction of the LED chip 10. The light emitted from the side of the LED chip 10 is transmitted through the encapsulation part 50 and then transmitted through the optical component 60 or the frame 40 and the air layer 80 and reaches the color-changing member 70 to excite the fluorescent material of the color-changing member 70 or passes through the color-changing member 70 without colliding with the fluorescent material.

The color-changing member 70 includes a formed product of a mixture of an optically transparent material such as silicone and particles of a yellow fluorescent material that emits broad yellow light when excited by blue light from the LED chip 10 (namely, the color-changing member 70 is composed of the optically transparent material and the fluorescent material). Therefore, blue light from the LED chip 10 and light from the yellow fluorescent material are released through the outer surface 70b of the color-changing member 70 so that the light-emitting device 1 can produce white light. The optically transparent material for use in the color-changing member 70 is not limited to silicone and may be an acrylic resin, glass, or an organic-inorganic hybrid material in which organic and inorganic components are mixed and bound at a nanometer or molecular level. The fluorescent material for use in combination with the optically transparent material of the color-changing member 70 is also not limited to a yellow fluorescent material. For example, red and green fluorescent materials may be mixed so that white light can be produced.

The color-changing member 70 has an inner surface 70a that is formed so as to be along the light output surface 60b of the optical component 60 and the outer surface of the frame 40. Therefore, the distance between the light output surface 60b and the inner surface 70a of the color-changing member 70 is substantially constant in the normal direction at all positions in the light output surface 60b of the optical component 60. The color-changing member 70 is formed such that its thickness along the normal direction is constant at all positions. For example, the color-changing member 70 may be bonded to the mount board 20 with an adhesive (such as a silicone resin, an epoxy resin or the like) at its edge on the mount board 20 side (the circular end of its opening).

As described above, the color-changing member 70 is placed such that the air layer 80 is formed between the color-changing member 70 and the light output surface 60b of the optical component 60 or the outer surface of the frame 40

(namely inside the color-changing member 70). The air layer 80 inside the color-changing member 70 can function as a thermal insulation layer to suppress the transfer of heat from the fluorescent material of the color-changing member 70 to the LED chip and to inhibit an increase in temperature of the LED chip. In addition, a reduction in yield attributable to the accuracy of dimension or alignment of the color-changing member 70 can be prevented, because bonding of the color-changing member 70 to the optical component 60 and the frame 40 is not necessary. In the process of assembling the light-emitting device 1, the color-changing member 70 may be incorporated by the final step, and the blending ratio of the fluorescent material to the optically transparent material in the color-changing member 70 may be controlled depending on the emission wavelength of the LED chip 10. Therefore, variations in the color can also be reduced using the color-changing member 70 controlled as described above.

As described above, the air layer 80 is formed between the color-changing member 70 and the optical component 60 or the frame 40. Therefore, the color-changing member 70 is less likely to come into contact with the optical component 60 or the frame 40, when an external force is applied to the color-changing member 70 to deform it, and the stress generated on the color-changing member 70 by the external force can be prevented from being transmitted to the LED chip or each bonding wire 14, so that fluctuations in the emission characteristics of the LED chip 10 or the breaking of each bonding wire 14 is less likely caused by the external force. Therefore, the reliability is advantageously increased. The air layer 80 formed as described above also provides the advantage that the moisture in the external atmosphere is less likely to reach the LED chip 10 and the advantage that when light emitted from the LED chip 10 enters the color-changing member 70 and is scattered by particles of the yellow florescent material in the color-changing member 70, the quantity of light scattered and transmitted through the optical component 60 or the frame 40 can be reduced so that the total light output efficiency of the light-emitting device 1 can be increased.

In the LED lighting fixture of the present embodiment, each light-emitting device 1 is bonded to the fixture body 100 with an insulating layer 90 interposed therebetween (specifically, each light-emitting device 1 is mounted on the bottom wall 100a of the fixture body 100 with the insulating layer 90 interposed therebetween). The insulating layer 90 has electrical insulating properties and is interposed between the heat transfer plate 21 and the fixture body 100 to thermally couple them.

In this structure, a bonding member made of a resin sheet that contains a filler of silica, alumina or the like and is capable of being reduced in viscosity when heated (for example, a organic green sheet such as an epoxy resin sheet highly charged with fused silica) is used to form the insulating layer 90. Alternatively, a green sheet made of a sheet-shaped green ceramic may be used as the insulating layer 90.

If a conventional radiating rubber sheet (heat transfer sheet) is interposed in place of the insulating layer 90, the heat transfer plate 21 and the radiating sheet can be insufficiently bonded to each other so that a void may be formed between them to increase the thermal resistance or cause variations in the thermal resistance of the portion from each light-emitting device 1 to the fixture body 100. Therefore, torque control is required when a load is applied to the heat transfer plate 21 and the like. If an insulating grease is used to form the insulating layer 90, formation of a void between the heat transfer plate 21 and the insulating layer 90 can be prevented, but the insulating layer 90 can undergo secular changes (such as a change in viscosity and shrinkage) so that a void can be formed between them to increase the thermal resistance or cause variations in the thermal resistance of the portion from each light-emitting device 1 to the fixture body 100.

In contrast, the bonding member made of the resin sheet having electrical insulating properties and high thermal conductivity also has high flowability during heating and high adhesion to irregular surfaces. Therefore, formation of a void between the bonding member and the heat transfer plate 21 or the fixture body 100 can be prevented in the process of bonding the heat transfer plate 21 of the mount board 20 to the metal fixture body 100 (the process of bonding the heat transfer plate 21 to the fixture body 100 by interposing the bonding member between the heat transfer plate 21 and the bottom wall 100a of the fixture body 100 and then heating the bonding member), so that adhesion reliability can be increased, while secular changes can be reduced, and an insufficient adhesion-induced increase or variation in thermal resistance can be prevented. It is also possible to prevent an increase in thermal resistance, which would otherwise be caused by formation of a void between the heat transfer plate 21 and the insulating layer 90 due to the secular change of the insulating layer 90. When the insulating layer 90 has an effective contact area of 25 mm$^2$ for heat transfer and a thickness of 0.1 mm, the insulating layer 90 should satisfy the requirement of having a thermal conductivity of 4 W/m·K or more in order that the thermal resistance of the insulating layer 90 may be controlled to 1 K/W or less. If the organic green sheet described above is used as the resin sheet, this requirement will be satisfied.

Figure 5:
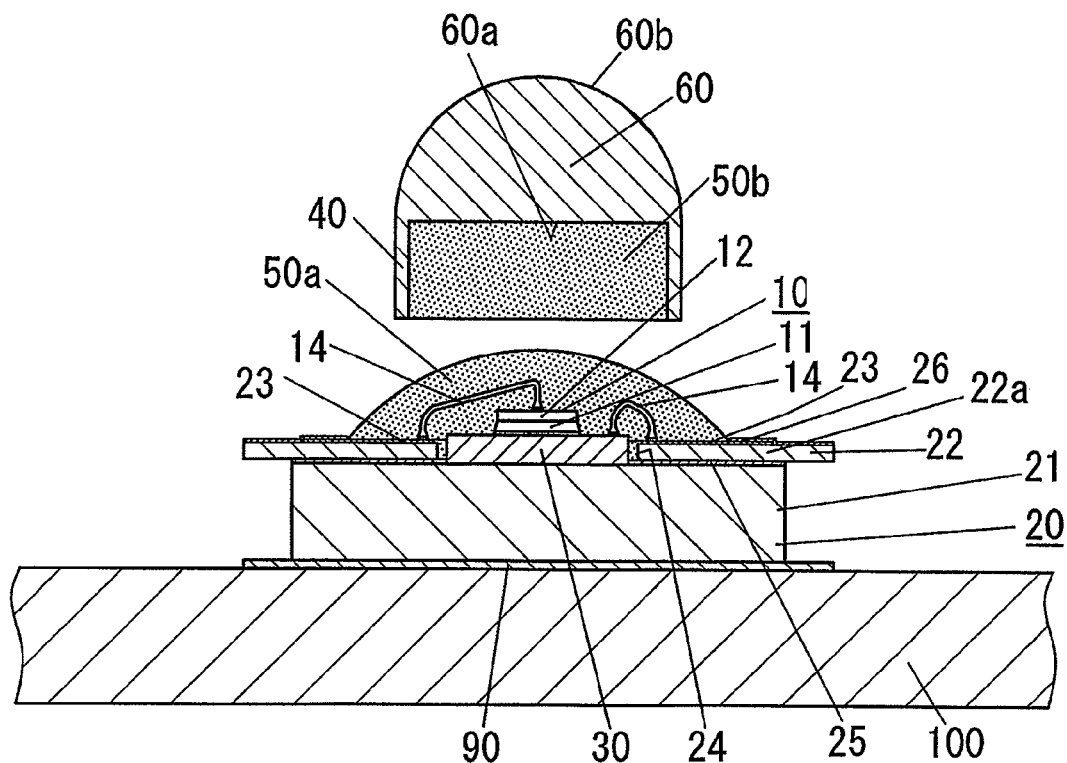
FIG. 5 is an illustrative diagram showing a method for manufacturing the light-emitting device in the LED lighting fixture of FIG. 1.

The LED lighting fixture of the present embodiment may be manufactured as described below. For example, the mount board 20 (a component of each light-emitting device 1) is first bonded to the fixture body 100 with the insulating layer 90 interposed therebetween by a thermocompression bonding technique or the like. The sub-mount member 30 to which the LED chip 10 has been previously bonded is then bonded to the heat transfer plate 21. Each electrode of the LED chip 10 is then electrically connected to each patterned conductor 23 of the mount board 20 through bonding wires 14, 14. As shown in FIG. 5, the LED chip 10 and the bonding wires 14, 14 are then covered with a first liquid encapsulant resin material 50a (such as a silicone resin) which will be a part of the encapsulation part 50. Thereafter, a second liquid encapsulant resin material (such as a silicone resin) which is the same as the first encapsulant resin material 50a and will be the other part of the encapsulation part 50 is injected into the space surrounded by the optical component 60 and the frame 40. The optical component 60 is then placed opposite to the mount board 20 such that the frame 40 is interposed between the optical component 60 and the mount board 20, and the respective encapsulant resin materials 50a and 50b are cured to form the encapsulation part 50. The color-changing member 70 is then bonded to the wiring board 22 of the mount board 20 with an adhesive (such as a silicone resin and an epoxy resin). In the present embodiment, the circular aperture 26a formed at the central portion of the resist layer 26 of the mount board 20 has an inner diameter slightly larger than the maximum outer diameter of a protective cover (color-changing member) 70. In the process of potting, part of the first encapsulant resin material 50a flowing to the vicinity of the inner peripheral surface of the aperture 26a is used as the adhesive for bonding the protective cover 70 to the mount board 20. Thereafter, the circuit board 200 is housed in and attached to the fixture body 100 and electrically connected to each light-emitting device 1 and to each wire, and the front cover is attached to the fixture body 100.

Figure 6:
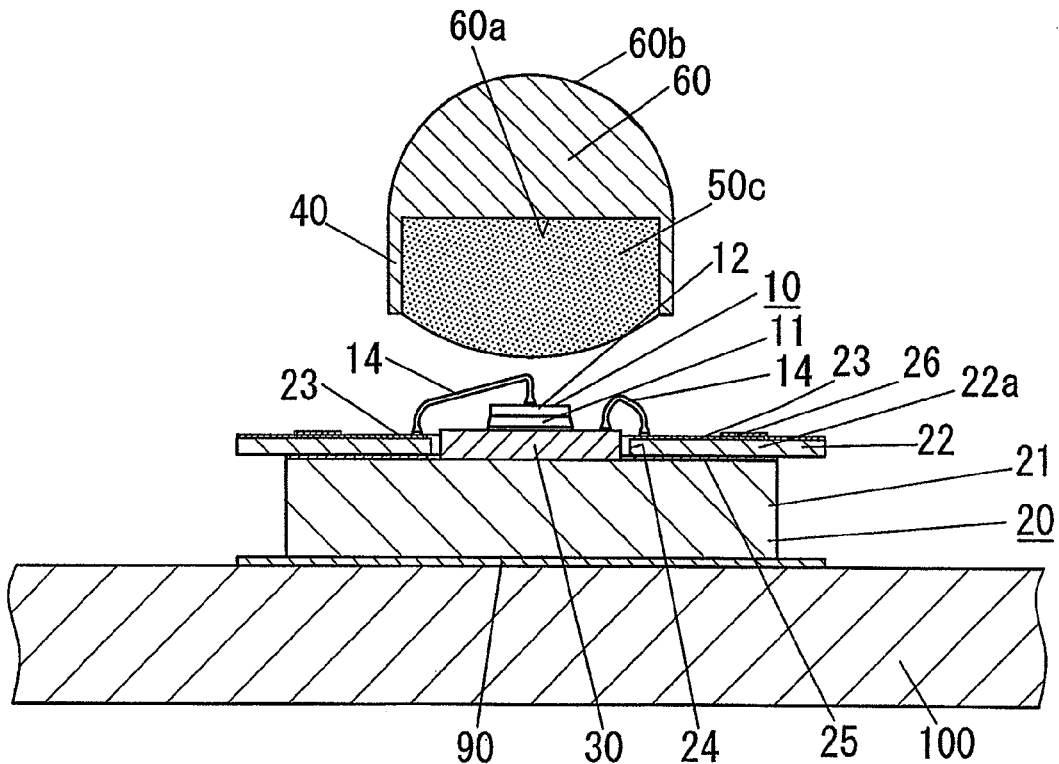
FIG. 6 is an illustrative diagram showing another method for manufacturing the light-emitting device in the LED lighting fixture of FIG. 1.

As shown in FIG. 6, another manufacturing method may be considered that include: electrically connecting the LED chip 10 to the bonding wires 14, 14; then injecting a liquid encapsulant resin material 50c (such as a silicone resin) for forming the encapsulation part 50 into the space surrounded by the optical component 60 and the frame 40; then placing the optical component 60 opposite to the mount board 20 such that the frame 40 is interposed between the optical component 60 and the mount board 20; and curing the encapsulant resin material 50c to form the encapsulation part 50. However, this production method has the risk of causing a void in the encapsulation part 50 in the manufacturing process. Therefore, the former manufacturing method should be used so that the manufacturing process can be less likely to cause a void in the encapsulation part 50 and can provide a highly-reliable, high-power light-emitting device 1. If the first encapsulant resin material 50a is cured before the second encapsulant resin material 50b is injected, the viscosity of the first encapsulant resin material 50a can be reduced so that a void trapped in the housing hole can be advantageously and easily removed.

The inner diameter of the aperture 26a at the central portion of the resist layer 26 may also be set slightly smaller than the maximum inner diameter of the protective cover 70, and the mount board 20 side-end of the protective cover 70 may be bonded to the peripheral portion of the aperture 26a of the resist layer 26 over the entire circumference with a bonding portion 75 made of an adhesive. In this case, the thickness of the bonding portion 75 interposed between the protective cover 70 and the mount board 20 can be easily controlled, and the reliability of the bonding between the protective cover and the mount board 20 can be increased. The adhesive for the bonding portion 75 is preferably the same as a material of the protective cover 70.

Figure 18:
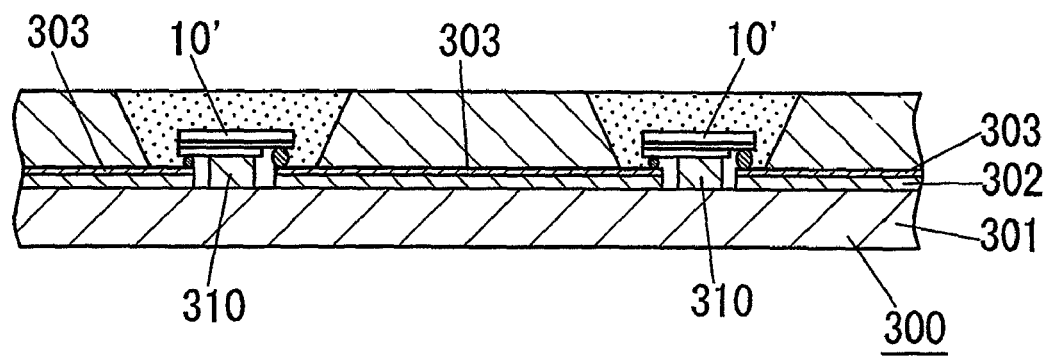
FIG. 18 is a schematic cross-sectional view of a conventional LED unit.
Figure 19:
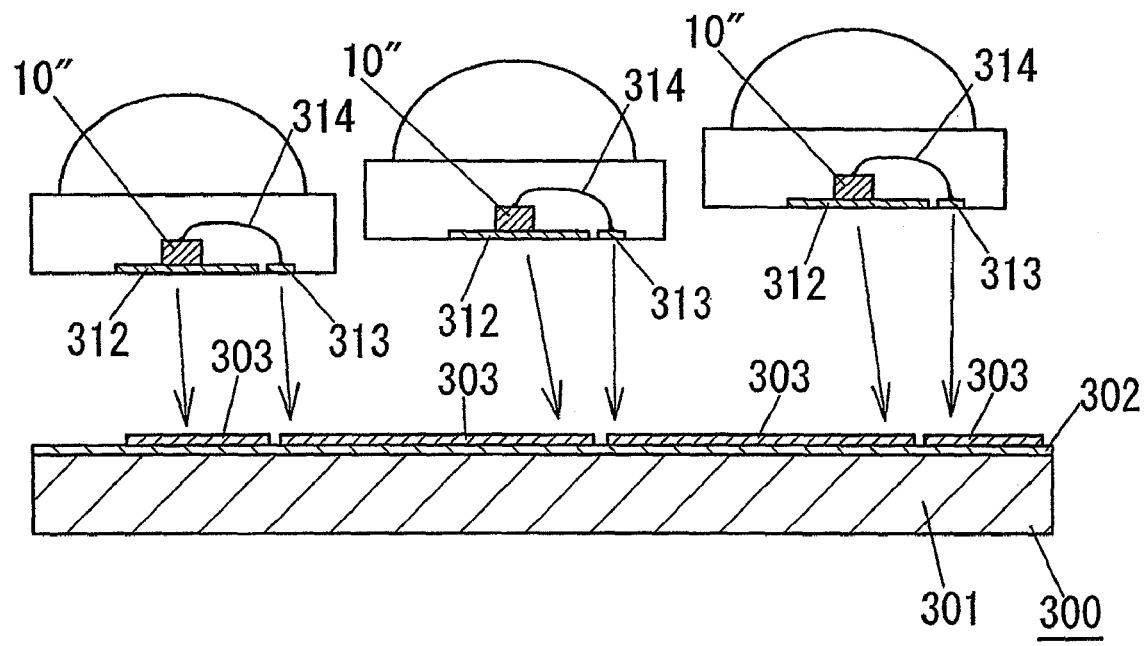
FIG. 19 is a schematic diagram of another conventional LED unit.

As described above, in the LED lighting fixture of the present embodiment, each light-emitting device 1 is bonded to the fixture body 100 with the insulating layer 90 interposed therebetween, and the insulating layer 90 has electrical insulating properties and is interposed between the heat transfer plate 21 and the fixture body 100 to thermally couple them. Therefore, heat generated at each light-emitting device 1 during lighting can be transferred to and released from the metal fixture body 100 through the insulating layer 90 without passing through the circuit board 200 having a relatively large thickness. As compared with a conventional structure having a radiating rubber sheet such as Sarcon (Registered Trademark) interposed between the circuit board 300 of an LED unit and a fixture body (see FIGS. 18 and 19), the present embodiment can reduce the thermal resistance of the portion from the LED chip 10 to the fixture body 100, increase the heat radiation performance, reduce variations in thermal resistance, and suppress the rise of the junction temperature of the LED chip 10, so that the input power and the light output power can be increased. In addition, the total thickness of the heat transfer plate 21 and the sub-mount member 30 in each light-emitting device 1 can be smaller than the thickness of the circuit board 300.

When used at the same light output power as a conventional LED lighting fixture, the LED lighting fixture of the present embodiment has the advantage that the junction temperature of the LED chip 10 can be lowered so that the LED chip 10 can have a long life, as compared with the conventional LED lighting fixture. In the LED lighting fixture of the present embodiment, the light-emitting device 1 has outer lead portions 23b, 23b that are formed by part of the patterned conductors 23, 23 on the LED chip 10 mount side of the mount board 20. Therefore, the light-emitting devices 1 may be connected through lead wires as appropriate without a circuit board 200 so that cost reduction can be achieved and that the flexibility of placement of the light-emitting devices 1 can be increased to facilitate the change of the number or layout of the light-emitting devices 1.

In each light-emitting device 1 of the LED lighting fixture of the present embodiment, the LED chip 10 is mounted on the heat transfer plate 21 with the sub-mount member 30 that is interposed therebetween and relaxes the stress applied to the LED chip 10 due to the linear expansion coefficient difference between the LED chip 10 and the heat transfer plate 21. Therefore, it is possible to prevent breakage of the LED chip 10 caused by the linear expansion coefficient difference between the LED chip 10 and the heat transfer plate 21 and to increase the reliability. However, the sub-mount member 30 is not necessarily provided between the LED chip 10 and the heat transfer plate 21, when the linear expansion coefficient difference between the LED chip 10 and the heat transfer plate 21 is relatively small. If the sub-mount member 30 is omitted between the LED chip 10 and the heat transfer plate 21, the distance between the LED chip 10 and the bottom wall 100a of the metal fixture body 100 can be reduced so that the thermal resistance of the portion from the light-emitting part 12 of the LED chip 10 to the fixture body 100 can be reduced and that the heat radiation performance can be further increased. Therefore, the light output power can be further increased.

The area of the sub-mount member 30 may be larger than that of the LED chip 10, and when the generatrix of a truncated cone having an upper base formed by a circle inscribed in the sub-mount member 30-facing surface of the LED chip 10 and having a lower base formed by a circle circumscribed about the other surface of the heat transfer plate 21 makes an angle θ of about 45° with the lower base, the sub-mount member 30 may be dimensionally set such that the rim of the sub-mount member 30 is placed outside the truncated cone, so that the heat from the LED chip 10 can be transferred to the entire other surface of the heat transfer plate 21 and that linear heat flow can be made to efficiently dissipate the heat.

In the LED lighting fixture of the present embodiment, the two-dimensional size of the insulating layer 90 is set larger than that of the heat transfer plate 21 so that the creeping distance between the heat transfer plate 21 made of a metallic material and the fixture body 100 (a metallic component) can be increased and that the lighting surge resistance can be enhanced, as compared with a case where the insulating layer 90 and the heat transfer plate 21 are formed in the same two-dimensional size. While the thickness of the insulating layer 90 should be designed depending on the desired withstand voltage, the insulating layer 90 is preferably set as thin as possible in terms of reducing the thermal resistance. Therefore, after the thickness of the insulating layer 90 is determined, the two-dimensional size should be determined to meet the requirement of the creeping distance.

In the LED lighting fixture of the present embodiment, the frame 40 of each light-emitting device 1 is made of an optically transparent material whose linear expansion coefficient is substantially the same as that of the encapsulant resin (the material for the encapsulation part 50) and whose refractive index and elastic modulus are not lower than those of the encapsulant resin, respectively. Therefore, the present embodiment can reduce the linear expansion difference between the frame 40 and the encapsulation part 50 and suppress formation of a void in the encapsulation part 50 at low temperature during a heat cycle test, as compared with a case where the frame 40 is made of a metallic material (such as Al). Therefore, the reliability can be increased, and the light reflection loss can be reduced on the frame 40, so that the light output power can be increased.

Figure 9:
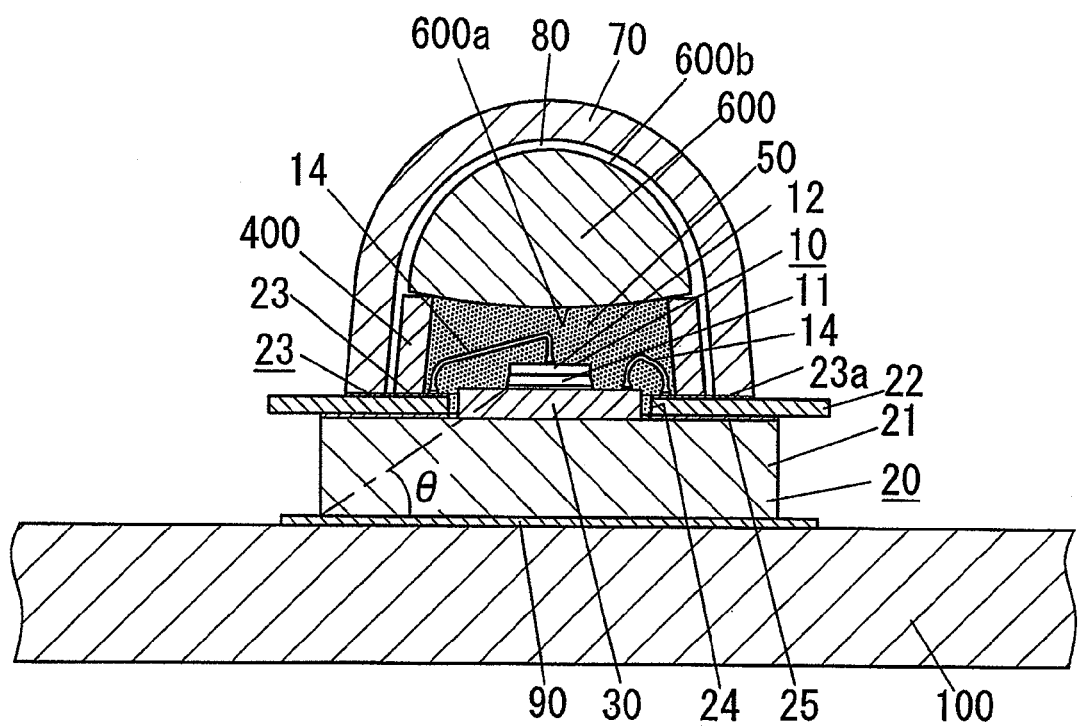
FIG. 9 is a schematic cross-sectional view showing another mode of light-emitting device in the LED lighting fixture of FIG. 1.
Figure 10:
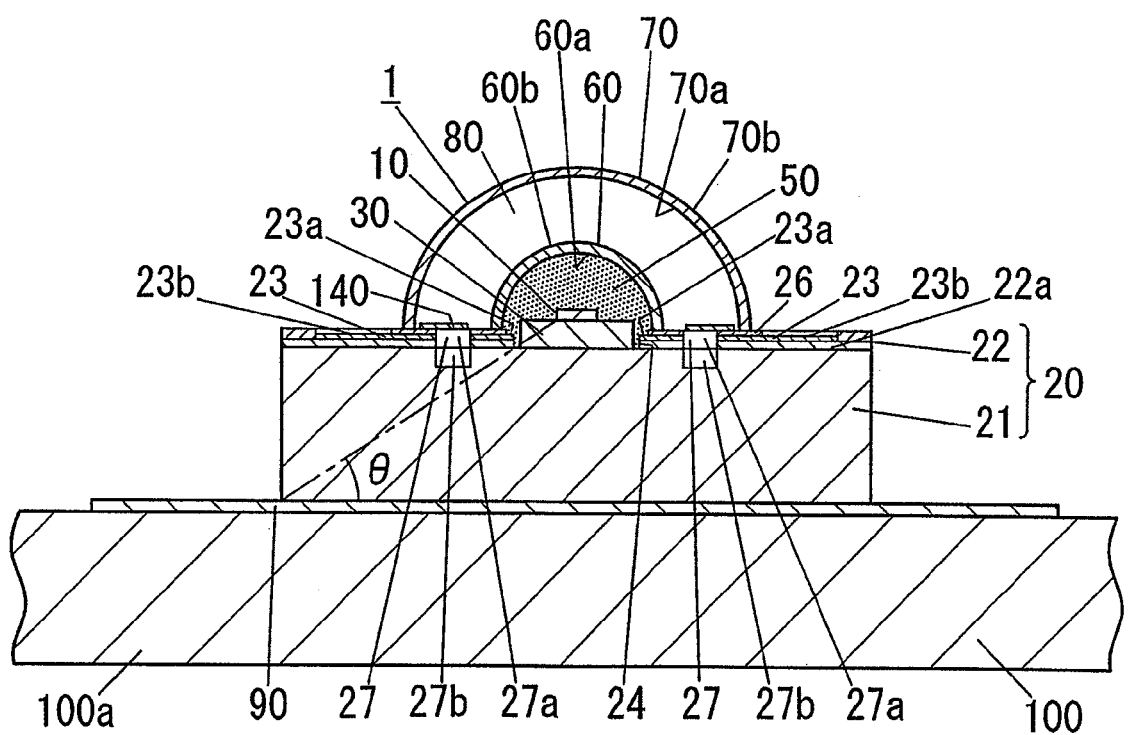
FIG. 10 is a schematic cross-sectional view of a light-emitting device in an LED lighting fixture according to Embodiment 2 of the present invention.
Figure 11:
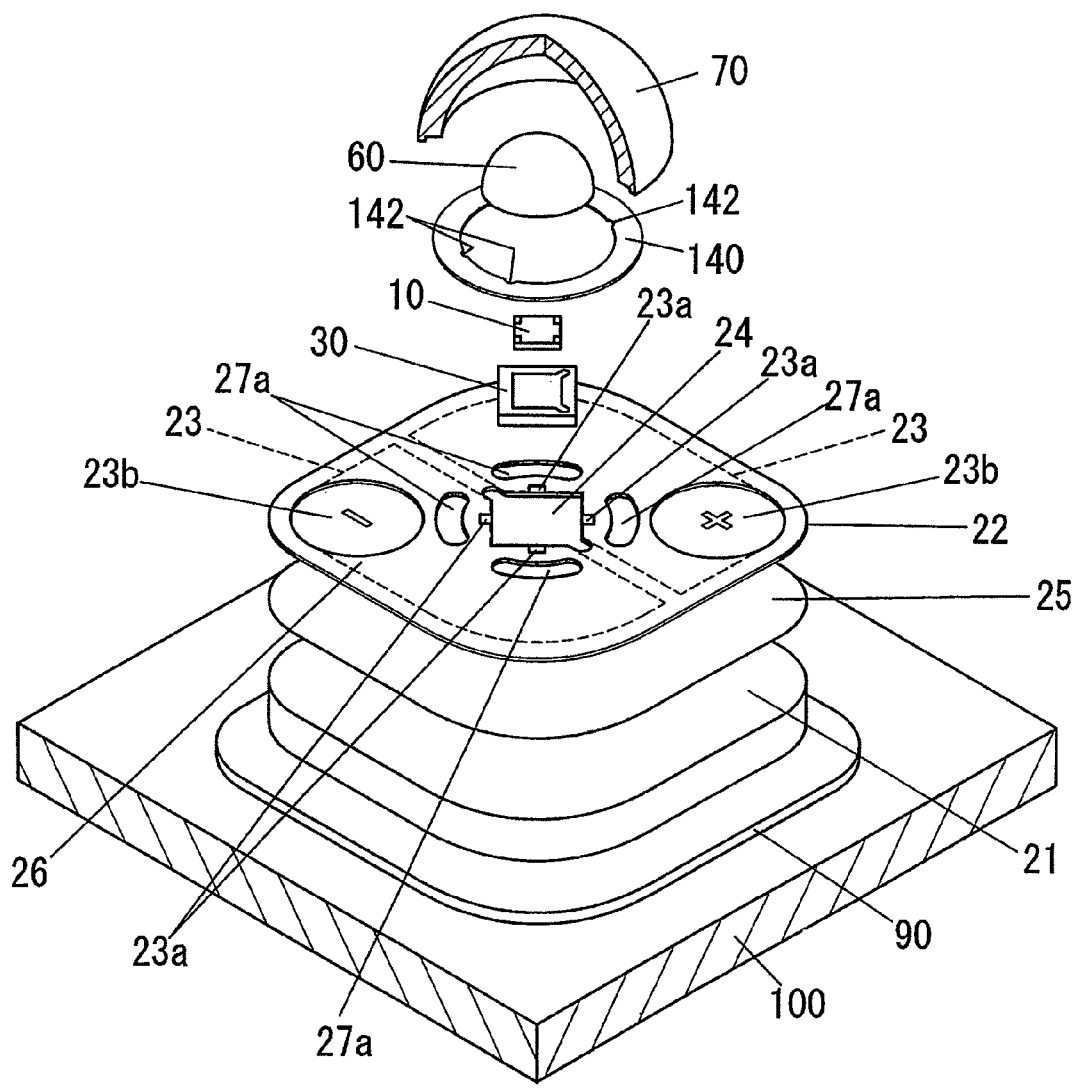
FIG. 11 is a partially exploded schematic perspective view showing the main part of the light-emitting device in the LED lighting fixture of FIG. 10.
Figure 12:
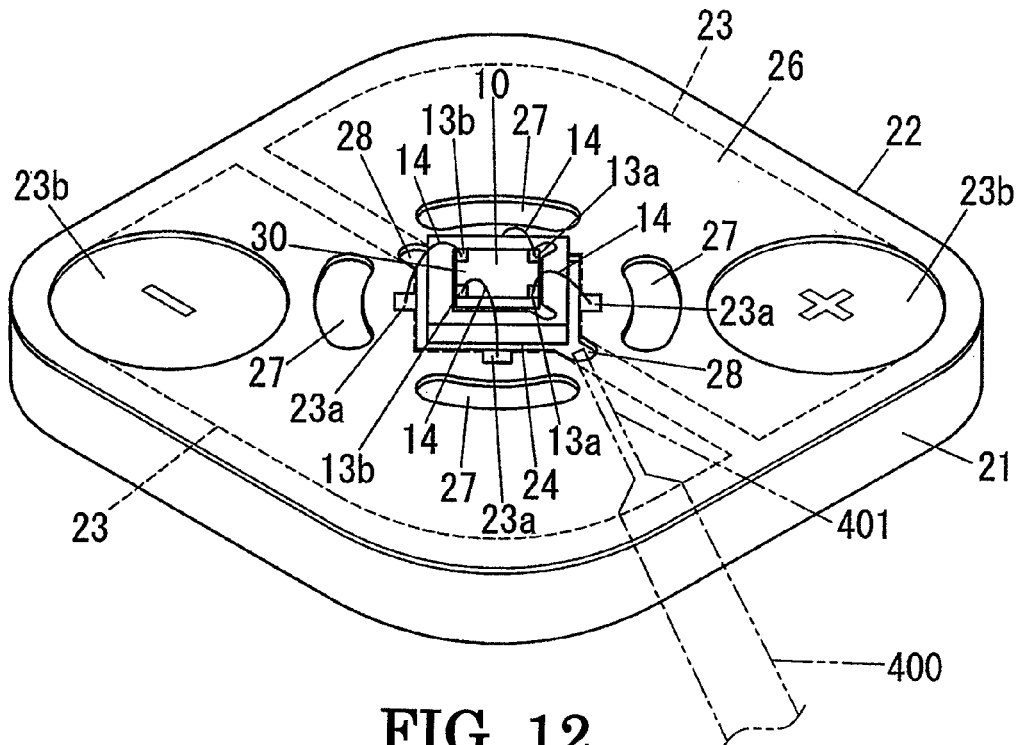
FIG. 12 is an illustrative diagram showing a method for manufacturing the light-emitting device in the LED lighting fixture of FIG. 10.

The frame 40 and the optical member 60 are integrally formed in the present embodiment. Alternatively, as shown in FIG. 9, the frame 400 may be provided separately from the optical component 600. In FIG. 9, the optical component 600 includes a biconvex lens having a convex light incidence surface 600*a* on the encapsulation part 50 side and a convex light output surface 600*b*. In this case, after the frame 400 is bonded to the mount board 20, the encapsulant resin may be charged (by potting) into the interior of the frame 400 and then cured to form the encapsulation part 50. Thereafter, the optical component 600 may be bonded to the encapsulation part 50 and the frame 400.

Embodiment 2

An LED lighting fixture according to the present embodiment is described below with reference to FIGS. 10 to 17 attached hereto.

The basic configuration of the LED lighting fixture of the present embodiment is substantially the same as that of Embodiment 1, except that there are differences in the structures of the light-emitting device 1 and the circuit board 200 between them. It should be noted that the same element as in Embodiment 1 is represented by the same reference mark, and a description thereof is omitted.

In the present embodiment, the light-emitting device 1 does not include the frame 40 described in Embodiment 1; the optical component 60 for controlling the distribution of light emitted from the LED chip 10 is in the form of a dome and placed on one side of the mount board 20 so as to house the LED chip 10 together with the mount board 20; the space surrounded by the optical component 60 and the mount board 20 is filled with the encapsulation part 50 in which the LED chip 10 and the bonding wires 14, 14 electrically connected to the LED chip 10 are encapsulated; and the color-changing member 70 is provided such that the air layer 80 is formed between the color-changing member 70 and the light output surface 60*b* of the optical component 60 on the one side of the mount board 20.

In the present embodiment, the wiring board 22 of the mount board 20 used is a flexible printed wiring board including an insulating substrate 22*a* made of a polyimide film and a pair of patterned power-supply conductors 23, 23 formed on one side of the substrate 22*a*.

In the present embodiment, the respective patterned conductors 23, 23 of the wiring board 22 are formed so as to have a rim slightly smaller than half of the rim of the insulating substrate 22*a*. FR4, RF5, paper phenol, or the like may also be used as the material for the insulating substrate 22*a*.

The resist layer 26 is patterned such that the respective patterned conductors 23, 23 are exposed at two locations in the vicinity of the aperture 24 of the wiring board 22 and exposed at one location in the peripheral portion of the wiring board 22. The respective patterned conductors 23, 23 have inner lead portions 23*a* (terminal portions) and outer lead portions 23*b* (electrode portions for external connection). The inner lead portions 23*a* are composed of two rectangular portions exposed in the vicinity of the aperture 24 of the wiring board 22, and the outer lead portions 23*b* is composed of a circular portion exposed in the peripheral portion of wiring board 22.

In the present embodiment, the LED chip 10 used has anode electrodes 13*a* at adjacent two of the four corners (see FIGS. 12 and 14A) and cathode electrodes 13*b* at the other two corners, on one surface side. Each anode electrode 13*a* is electrically connected to one of the patterned conductors 23 through the bonding wire 14, and each cathode electrode 13*b* is electrically connected to the other patterned conductor 23 through the bonding wire 14. Out of the two outer lead portions 23*b*, the outer lead portion 23*b* (on the right in FIG. 12) electrically connected to each anode electrode 13*a* of the LED chip 10 is marked with "+," and the outer lead portion 23*b* (on the left in FIG. 12) electrically connected to each cathode electrode 13*b* of the LED chip 10 is marked with "−." In the light-emitting device 1, therefore, the polarity of both outer lead portions 23*a* and 23*b* are visually recognizable so that misconnection can be prevented.

In the present embodiment, the aperture 24 of the wiring board 22 is rectangular, and as shown in FIG. 14A, the inner lead portion 23*a* is provided in the vicinity of the center of each side of the rectangular aperture 24. Alternatively, as shown in FIG. 14B, the inner lead portion 23*a* may be provided in the vicinity of one end of each side of the aperture 24. In this case, the full length of the bonding wire 14 can be longer so that breakage of the bonding wire 14 due to the expansion and contraction of the encapsulation part 50 can be less likely to occur and that the reliability can be increased.

In the present embodiment, the LED chip 10 is a blue LED chip using a 6H—SiC substrate as the crystal growth substrate, and AlN, which has relatively high thermal conductivity and insulating properties, is used as the material for the sub-mount member 30 as in Embodiment 1. However, the material for the sub-mount member 30 is not limited to AlN and may be any other material having a relatively high thermal conductivity and a liner expansion coefficient relatively close to that of 6H—SiC (the material for the crystal growth substrate), such as complex SiC, Si, Cu, and CuW.

In the present embodiment, the sub-mount member 30 of the light-emitting device 1 also has such a thickness that the surface of the sub-mount member 30 is more distant from the heat transfer plate 21 than from the surface of the resist layer 26 of the wiring board 22. Therefore, light emitted from the LED chip 10 to the side can be prevented from being absorbed into the wiring board 22 through the inner circumference surface of the aperture 24 of the wiring board 22. If, as in Embodiment 1, a reflecting film for reflecting light from the LED chip 10 is formed on the surface of the sub-mount member 30 around the joint portion with the LED chip 10 on the side where the LED chip 10 is bonded, light from the side of the LED chip 10 can be prevented from being absorbed into the sub-mount member 30 so that the light output efficiency can be further increased.

The optical component 60 is made of an optically transparent material (such as silicone) as in Embodiment 1, but it is in the form of a dome, not in the form of a plano-convex lens as in Embodiment 1. In the present embodiment, the light output surface 60*b* of the optical component 60 is in the form of a convex surface that does not allow light from the light incidence surface 60*a* to be totally reflected at the interface between the light output surface 60*b* and the air layer 80 described above. The optical component 60 is placed such that its optical axis coincides with that of the LED chip 10. Therefore, light emanating from the LED chip 10 and entering the light incidence surface 60*a* of the optical component 60 can easily reach the color-changing member 70 without being totally reflected at the interface between the light output surface 60*b* and the air layer 80 so that the total luminous flux can be increased. The light emitted from the side of the LED chip 10 is transmitted through the encapsulation part 50 and then transmitted through the optical component 60 and the air layer 80 and reaches the color-changing member 70 to excite the fluorescent material of the color-changing member 70 or passes through the color-changing member 70 without colliding with the fluorescent material. The optical component 60 is also formed such that its thickness along the normal direction is constant at all positions.

The color-changing member 70 has an inner surface 70a that is formed so as to be along the light output surface 60b of the optical component 60. Therefore, the distance between the light output surface 60b and the inner surface 70a of the color-changing member 70 is substantially constant in the normal direction at all positions in the light output surface 60b of the optical component 60.

Figure 13:
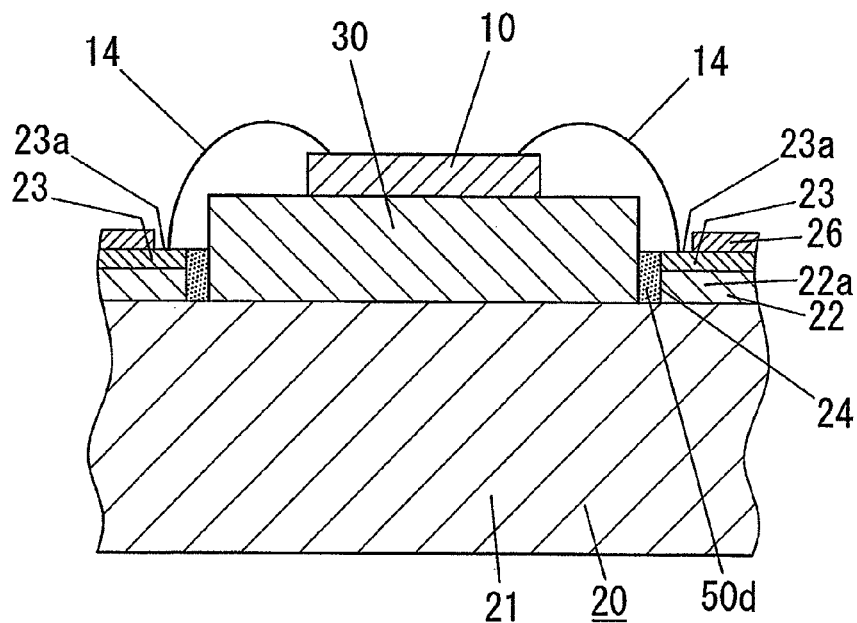
FIG. 13 is an illustrative diagram showing another method for manufacturing the light-emitting device in the LED lighting fixture of FIG. 10.
Figure 14:
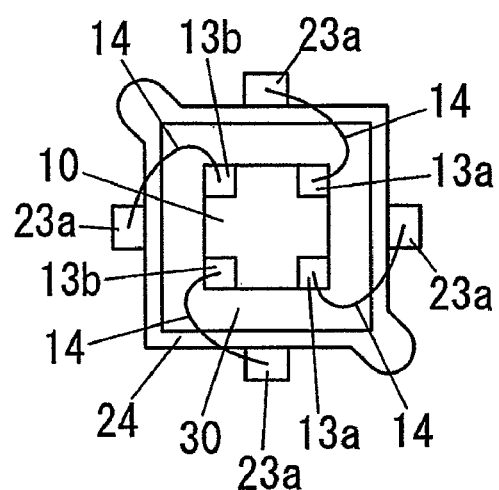
FIG. 14A is an illustrative diagram showing the main part of the light-emitting device in the LED lighting fixture of FIG. 10.
FIG. 14B is an illustrative diagram showing the main part of another light-emitting device in the LED lighting fixture of FIG. 10.
Figure 14:
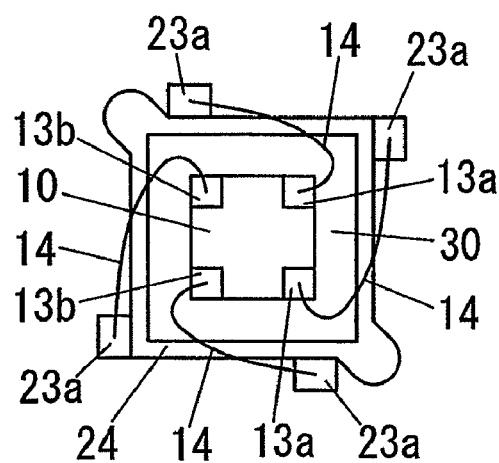
Figure 15:
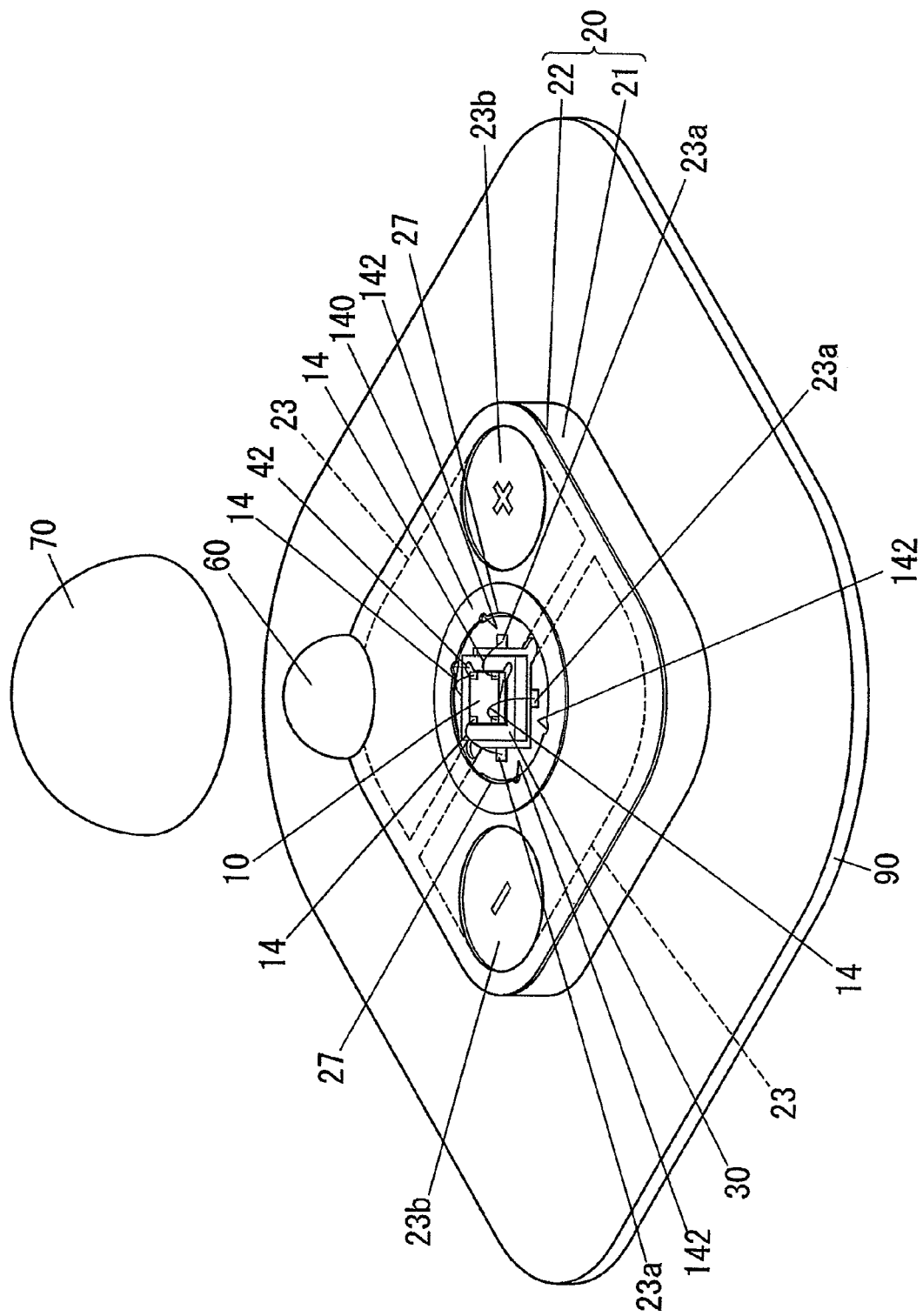
FIG. 15 is an exploded schematic perspective view of the light-emitting device in the LED lighting fixture of FIG. 10.

The light-emitting device 1 may be manufactured by the method described below. For example, after the LED chip 10 is electrically connected to the respective patterned conductors 23, 23 through the two bonding wires 14, respectively, the front end of the nozzle 401 of a dispenser 400 is aligned with a resin injection hole 28 that is formed continuously with the aperture 24 of the wiring board 22, and a liquid encapsulant resin (such as a silicone resin), which will be a part of the encapsulation part 50, is injected into the space between the sub-mount member 30 and the wiring board 22 and cured (a resin portion 50d made of the encapsulant resin is shown in FIG. 13). A liquid encapsulant resin (such as a silicone resin), which will be the other part of the encapsulation part 50, is injected into the interior of the dome-shaped optical component 60. Thereafter, the optical component 60 is placed at a given location on the mount board 20, and the encapsulant resin is cured, so that the encapsulation part 50 is formed, while the optical component 60 is bonded to the mount board 20. Thereafter, the color-changing member 70 is bonded to the mount board 20. This manufacturing method can suppress formation of a bubble (void) in the encapsulation part 50 during the manufacturing process and reduce the possibility of void-induced stress concentration on the boding wire 14 so that the reliability can be increased. Even when such a manufacturing method is used, however, there is the risk of forming a bubble (void) in the encapsulation part 50 during the manufacturing process. Therefore, a relatively large amount of the liquid encapsulant resin should be injected into the optical component 60.

When this manufacturing method is used, however, the process of placing the optical component 60 at a given place on the mount board 20 can involve the overflow of part of the liquid encapsulant resin from the space surrounded by the optical component 60 and the mount board 20 and involve the spread of the resin on the surface of the resist layer 26. The overflowing encapsulant resin can form an unnecessary portion which can cause absorption of light or have irregularities to cause diffused reflection of light so that the total light output efficiency of the light-emitting device 1 can be reduced.

In the light-emitting device 1 of the present embodiment, therefore, a plurality of resin trapping holes 27 for receiving the encapsulant resin overflowing from the space surrounded by the optical component 60 and the mount board 20 are formed at intervals on the one side of the mount board 20 in the circumferential direction of the optical component 60 between the portion overlaid with the annular edge of the optical component 60 and the portion overlaid with the annular edge of the color-changing member 70. In this structure, each resin trapping hole 27 includes a through hole 27a formed in the wiring board 22 and a dent portion 27b formed on the heat transfer plate 21 at a site corresponding to the through hole 27a. Even when the wiring board 22 is thin, therefore, the resin trapping hole 27 can be made deep such that a relatively large amount of the encapsulant resin can be trapped in the hole 27. In addition, the encapsulant resin cured in the resin trapping hole 27 can function as a heat insulating part to block heat transfer from the LED chip 10 to the color-changing member 70 so that an increase in temperature of the color-changing member 70 associated with heat generation from the LED chip 10 can be suppressed. Therefore, it is possible to suppress a reduction in the luminous efficiency of the fluorescent material, which is caused by heat generation from the LED chip 10.

The light-emitting device 1 also has a light absorption-preventing ring board 140 that covers each resin trapping hole 27 and is placed on the one side of the mount board 20 between the portion overlaid with the annular edge of the optical component 60 and the portion overlaid with the annular edge of the color-changing member 70. The light absorption-preventing board 140 prevents absorption of light into the cured encapsulant resin portion entrapped in each resin trapping hole 27. On the side opposite to the mount board 20 side, the light absorption-preventing board 140 has a white-colored resist layer to reflect light from the LED chip 10, the color-changing member 70 or the like so that the light absorption can be prevented. The light absorption-preventing board 140 may be placed on the one side of the mount board 20, after the overflowing encapsulant resin is trapped in each resin trapping hole 27 in the process of placing the optical component 60 at a given location on the mount board 20. Thereafter, the light absorption-preventing board 140 may be bonded to the mount board 20 with the encapsulant resin in the process of curing the encapsulant resin. The light absorption-preventing ring board 140 also has a plurality of notches 142 through which a small part of each resin trapping hole 27 is exposed, so that formation of a void can be prevented when the encapsulant resin is cured in the resin trapping hole 27.

In the light-emitting device 1 described above, the resin trapping holes 27 are formed on the one side of the mount board 20 between the portion overlaid with the mount board 20 side-edge of the optical component 60 and the portion overlaid with the mount board 20 side-edge of the color-changing member 70. Therefore, the encapsulant resin is trapped in the resin trapping holes 27 and prevented from overflowing in the process of bonding the color-changing member 70 to the mount board 20, and the encapsulant resin is prevented from overflowing and forming an unnecessary portion on the one side of the mount board 20, so that a reduction in light output efficiency can be prevented, which would otherwise be caused by absorption of light into the unnecessary portion or by diffused reflection of light on irregularities of the unnecessary portion. Therefore, light output power can be increased.

In the light-emitting device 1 of the present embodiment, the plurality of resin trapping holes 27 are placed at intervals in the circumferential direction of the optical component 60. Therefore, while the distance between the portion overlaid with the mount board 20 side-edge of the optical component 60 and the portion overlaid with the mount board 20 side-edge of the color-changing member 70 can be shortened on the one side of the mount board 20, the encapsulant resin can be prevented from forming an unnecessary portion on the one side of the mount board 20. The separation of the patterned conductors 23, 23 by the resin trapping holes 27 is also prevented so that the power supply wiring for the LED chip 10 can have low resistance.

Figure 16:
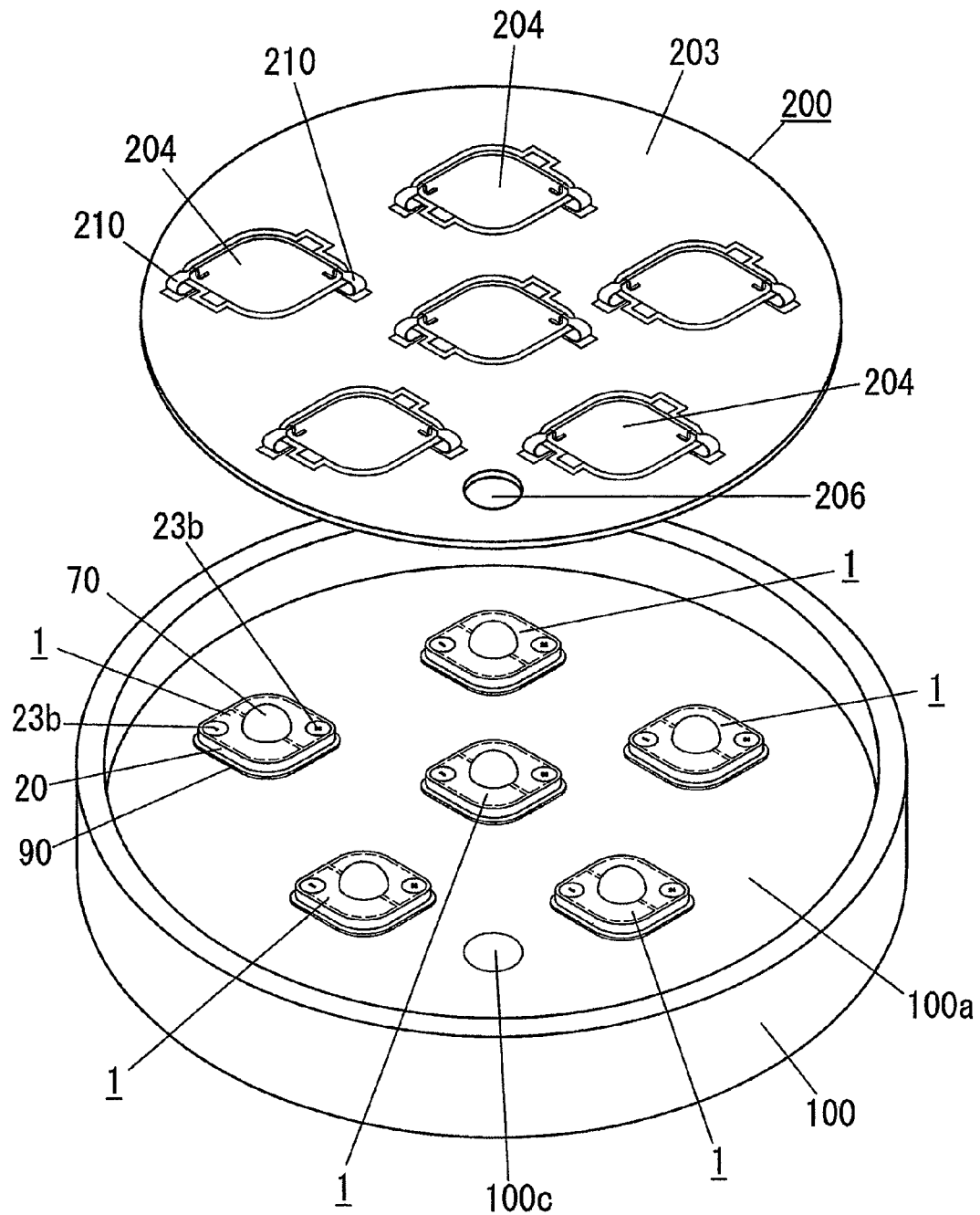
FIG. 16 is an exploded schematic perspective view of the main part of the LED lighting fixture of FIG. 10.
Figure 17:
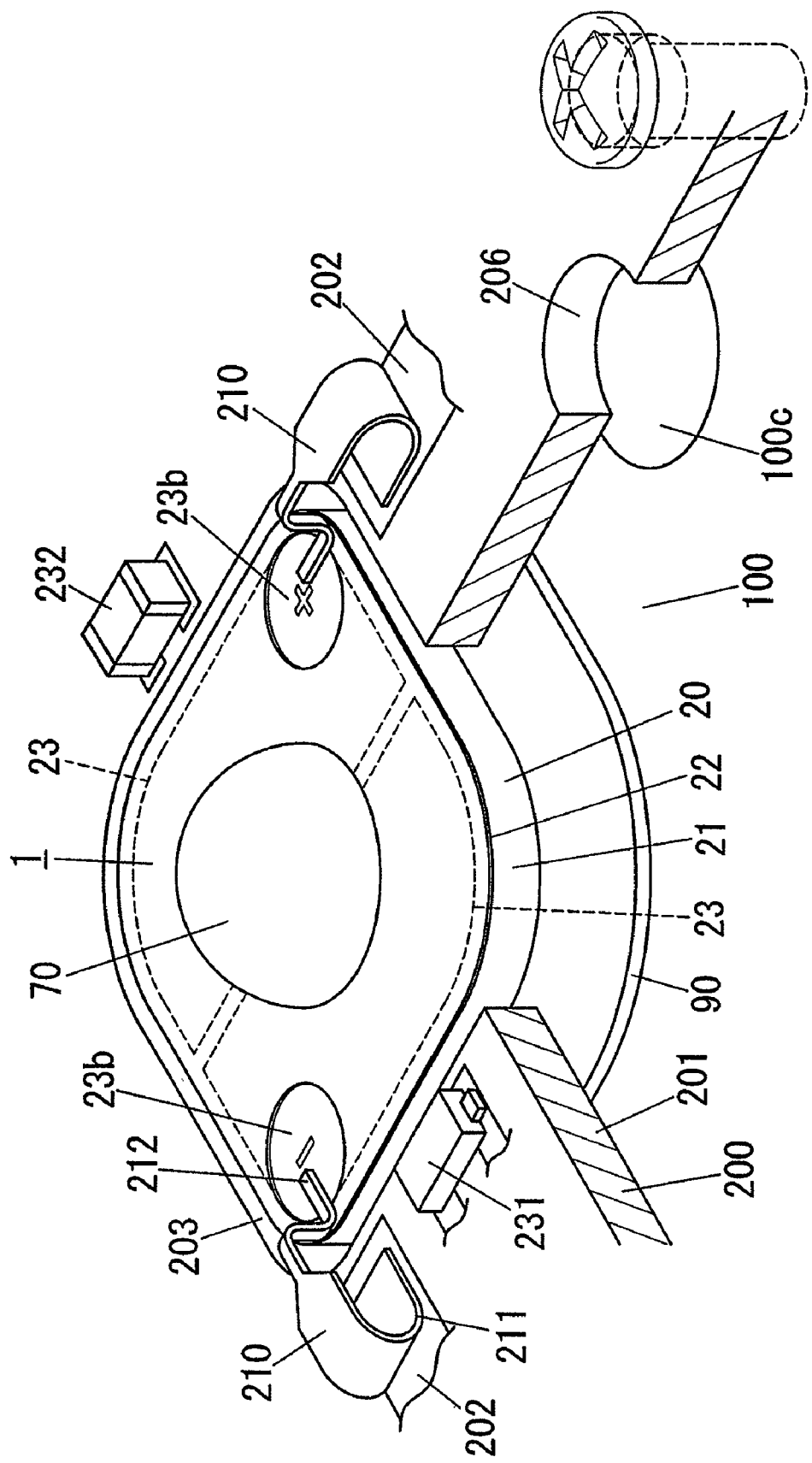
FIG. 17 is a partially exploded schematic perspective view of the main part of the LED lighting fixture of FIG. 10.

Referring to FIGS. 16 and 17, a circuit board 200 has a wire insertion hole 206 formed therethrough. A pair of power supply wires (lead wires) are inserted into the hole 206 through an insertion hole 100c formed through the bottom wall 100a of the fixture body 100 and electrically connected. The circuit board 200 also has patterned wirings 202 and a light reflecting layer 203 that covers the major portions of the patterned wirings 202 and formed of a white-colored resist layer on the surface opposite to the bottom wall 100a side of the fixture body 100.

The circuit board 200 has apertures 204. The size of each aperture 204 is slightly larger than the two-dimensional size of the mount board 20 of the light-emitting device 1. When viewed from the top, the mount board 20 of the light-emitting device 1 according to the present embodiment has four chamfered corners, in which the chamfered corners in the vicinity of the respective outer lead portions 23b (the left and right chamfered corners in FIG. 16) each have a radius of curvature larger than that of the other two chamfered corner (the upper and lower chamfered corners in FIG. 16). On the one side of the circuit board 200, therefore, the patterned wirings 202 can be formed in a relatively large area. As shown in FIG. 17, in order to prevent the application of overvoltage to the LED chip 10 of the light-emitting device 1, an overvoltage-preventing, surface-mounted Zener diode 231 and a surface-mounted ceramic capacitor 232 are mounted on the circuit board 200 in the vicinity of each aperture 204.

In the light-emitting device 1, each outer lead portion 23b of the mount board 20 is electrically connected to the patterned conductor 202 of the circuit board 200 through a terminal plate 210. In this structure, the terminal plate 210 includes terminal portions 211 and 212. The terminal portion 211 is formed by bending one end of a slender metal plate into an L-shape and bonded to the patterned wiring 202 with a solder or the like such that its thickness direction coincides with that of the patterned wiring 202. The terminal portion 212 is formed by bending the other end of the slender metal plate into a J-shape and bonded to the outer lead portion 23b with a solder or the like such that its thickness direction coincides with that of the outer lead portion 23b. This structure can relax the stress generated at the joint portion between the joining terminal 210 and each of the outer lead portion 23b and the patterned wiring 202 due to the linear expansion coefficient difference between the fixture body 100 and the circuit board 200, so that the reliability of the connection between each light-emitting device 1 and the circuit board 200 can be increased.

Also in the LED lighting fixture of the present embodiment described above, each light-emitting device 1 is bonded to the fixture body 100 with the insulating layer 90 interposed therebetween, and the insulating layer 90 has electrical insulating properties and is interposed between the heat transfer plate 21 and the fixture body 100 to thermally couple them, as in Embodiment 1. As compared with a conventional structure having a radiating rubber sheet such as Sarcon (Registered Trademark) interposed between the circuit board 300 of an LED unit and a fixture body (see FIGS. 18 and 19), therefore, the present embodiment can reduce the thermal resistance of the portion from the LED chip 10 to the fixture body 100, increase the heat radiation performance, reduce variations in thermal resistance, and suppress the rise of the junction temperature of the LED chip 10, so that the input power and the light output power can be increased.

In each of the above-described embodiments, the insulating layer 90 is provided for each light-emitting device 1. Alternatively, a single piece of the resin sheet slightly smaller than the bottom wall 100a of the fixture body 100 may be shared amount the plurality of light-emitting devices 1. The optical component 60 is not necessarily provided and may be provided as needed. When the color of the emission from the LED chip 10 is the desired color for the light-emitting device 1, a protective cover made of a fluorescent material-free, optically transparent material may be provided in place of the color-changing member 70. The fixture body 100 may also be in any other form such as the form of a flat plate. While a spotlight is illustrated as the LED lighting fixture in each of the embodiments, LED lighting fixtures to which the technical idea of the present invention is applicable include not only spotlights but also a variety of other LED lighting fixtures such as ceiling lights to be attached to building elements such as ceiling members.

The invention claimed is:

1. An LED lighting fixture comprising:
   a light-emitting device that includes
      an LED chip,
      a heat transfer plate made of a thermally conductive material and having one side on which the LED chip is mounted,
      a sub-mount member interposed between the LED chip and the heat transfer plate,
      a wiring board having on one side a patterned conductor for supplying an electric power to the LED chip, being bonded to an LED chip mount-side of the heat transfer plate, and being formed with an exposure part through which the LED chip mount-side on the heat transfer plate is exposed,
      an encapsulation part in which the LED chip is encapsulated on the one side of the wiring board, and
      a dome-shaped color-changing member formed with an optically transparent material and a fluorescent material excited by light emitted from the LED chip and emitting light of a color different from a color of the light emitted from the LED chip, and placed to surround the encapsulation part on the one side of the wiring board;
   a metal fixture body on which the LED chip-containing light-emitting device is held; and
   an insulating layer having electrical insulating properties and being interposed between the heat transfer plate and the fixture body to thermally couple the same, wherein
   the light-emitting device is bonded to the fixture body with the insulating layer interposed therebetween,
   a surface area of the sub-mount member is larger than a surface area of the LED chip, and
   a rim of the sub-mount member is placed outside the boundary of a truncated cone shape having an upper base formed by a circular perimeter of a sub-mount member-facing surface of the LED chip and a lower base formed by a circular perimeter of a bottom surface of the heat transfer plate.

2. The LED lighting fixture according to claim 1, wherein the sub-mount member reduces a stress applied to the LED chip due to a difference in coefficient of linear expansion between the LED chip and the heat transfer plate.

3. The LED lighting fixture according to claim 1, wherein the truncated cone shape has a generatrix that makes an angle of 45° with the lower base.

4. The lighting fixture according to claim 1, wherein the insulating layer is formed with a resin sheet that contains a filler and is reduced in viscosity when heated.

5. The LED lighting fixture according to claim 1, wherein the insulating layer is set to have a two-dimensional size larger than that of the heat transfer plate.

6. The LED lighting fixture according to claim 1, wherein the color-changing member is placed such that an air layer is formed inside the color-changing member.

* * * * *